United States Patent
Charpie et al.

(10) Patent No.: US 10,449,678 B2
(45) Date of Patent: Oct. 22, 2019

(54) BOAT, ASSEMBLY AND METHOD FOR HANDLING ELECTRONIC COMPONENTS

(71) Applicant: Rasco GMBH, Kolbermoor (DE)

(72) Inventors: Michel Charpie, Les Fins (FR); Rainer Hittmann, Grosskarolinenfeld (DE); Serge Künzli, La Chaux-de-Fonds (CH); Max Schaule, Mindelheim (DE); Dieter Schmid, Bruckmühl (DE); Andreas Wiesböck, Stephanskirchen (DE); Thomas Schottl, Bad Feilnbach (DE)

(73) Assignee: Rasco GMBH, Kolbermoor (DE)

( * ) Notice: Subject to any disclaimer, the term of this patent is extended or adjusted under 35 U.S.C. 154(b) by 133 days.

(21) Appl. No.: 15/560,922

(22) PCT Filed: May 26, 2015

(86) PCT No.: PCT/EP2015/061613
§ 371 (c)(1),
(2) Date: Sep. 22, 2017

(87) PCT Pub. No.: WO2016/188569
PCT Pub. Date: Dec. 1, 2016

(65) Prior Publication Data
US 2018/0050455 A1 Feb. 22, 2018

(51) Int. Cl.
*B25J 15/06* (2006.01)
*G01R 31/28* (2006.01)
(Continued)

(52) U.S. Cl.
CPC .......... *B25J 15/0616* (2013.01); *B65G 29/00* (2013.01); *B65G 47/847* (2013.01); *B65G 47/91* (2013.01);
(Continued)

(58) Field of Classification Search
CPC . B25J 15/0616; B25J 15/0625; B65G 47/847; B65G 47/91; G01R 31/2808;
(Continued)

(56) References Cited

U.S. PATENT DOCUMENTS

| 7,033,142 B2 * | 4/2006 | Conrad | F04D 19/04 417/201 |
| 2008/0101894 A1 * | 5/2008 | Cheng | H01L 21/67092 414/222.13 |

(Continued)

FOREIGN PATENT DOCUMENTS

| EP | 1788617 A1 | 5/2007 |
| WO | WO-2007007642 A1 | 1/2007 |

OTHER PUBLICATIONS

International Search Report & Written Opinion for PCT/EP2015/061613, dated Mar. 17, 2016, 12 pages.

*Primary Examiner* — Ronald P Jarrett
(74) *Attorney, Agent, or Firm* — Blank Rome LLP

(57) ABSTRACT

According to the invention, there is provided a boat which comprises, a surface on which a plurality of electronic components can be supported, the surface having a plurality holes defined therein through which a vacuum can be passed to hold components on the surface; and a first vacuum inlet which is in fluid communication with the plurality of holes, wherein the first vacuum inlet can be fluidly connected to a first vacuum generating means so that the first vacuum generating means can provide a vacuum at the plurality of holes; a second vacuum inlet which is in fluid communication with the same plurality of holes with which the first vacuum inlet is in fluid communication with, wherein the second vacuum inlet can be fluidly connected to a second vacuum generating means so that the second vacuum generating means can provide a vacuum at the plurality of holes. There is further provided a corresponding method of han-
(Continued)

dling electrical components using the boat and a corresponding component handling assembly which comprises one or more boats.

16 Claims, 19 Drawing Sheets

(51) Int. Cl.
    *H01L 21/673*     (2006.01)
    *H01L 21/683*     (2006.01)
    *H05K 13/00*     (2006.01)
    *B65G 29/00*     (2006.01)
    *B65G 47/86*     (2006.01)
    *B65G 47/91*     (2006.01)
    *H01L 21/67*     (2006.01)

(52) U.S. Cl.
    CPC ..... *G01R 31/2808* (2013.01); *G01R 31/2867* (2013.01); *H01L 21/67103* (2013.01); *H01L 21/67333* (2013.01); *H01L 21/6838* (2013.01); *H05K 13/0084* (2013.01); *B65G 2201/02* (2013.01); *Y10S 901/40* (2013.01)

(58) Field of Classification Search
    CPC .......... G01R 31/2867; H01L 21/67103; H01L 21/6733; H01L 21/6838; H01L 21/67389; H01L 21/67393
    USPC ....................................................... 294/188
    See application file for complete search history.

(56) References Cited

U.S. PATENT DOCUMENTS

| | | |
|---|---|---|
| 2009/0311087 A1 | 12/2009 | Na et al. |
| 2011/0236161 A1 | 9/2011 | Cheng et al. |
| 2017/0009342 A1* | 1/2017 | Xiang .................... C23C 16/52 |

* cited by examiner

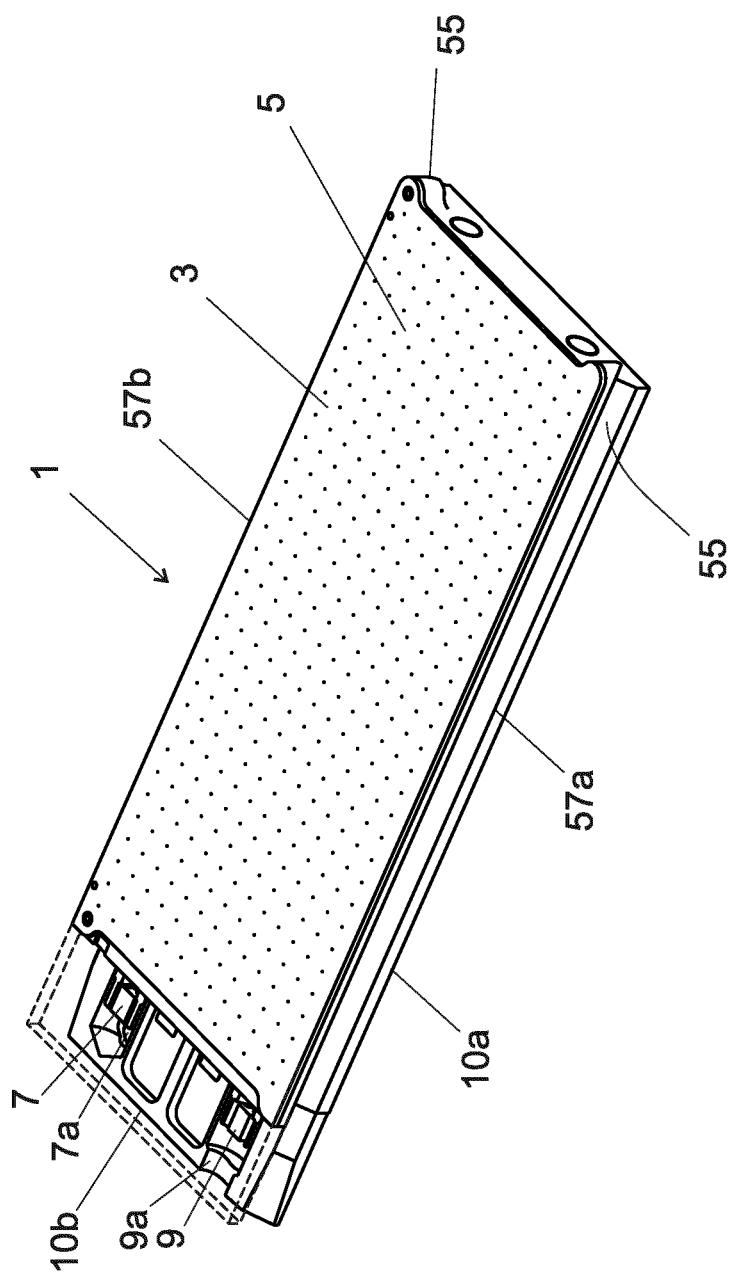

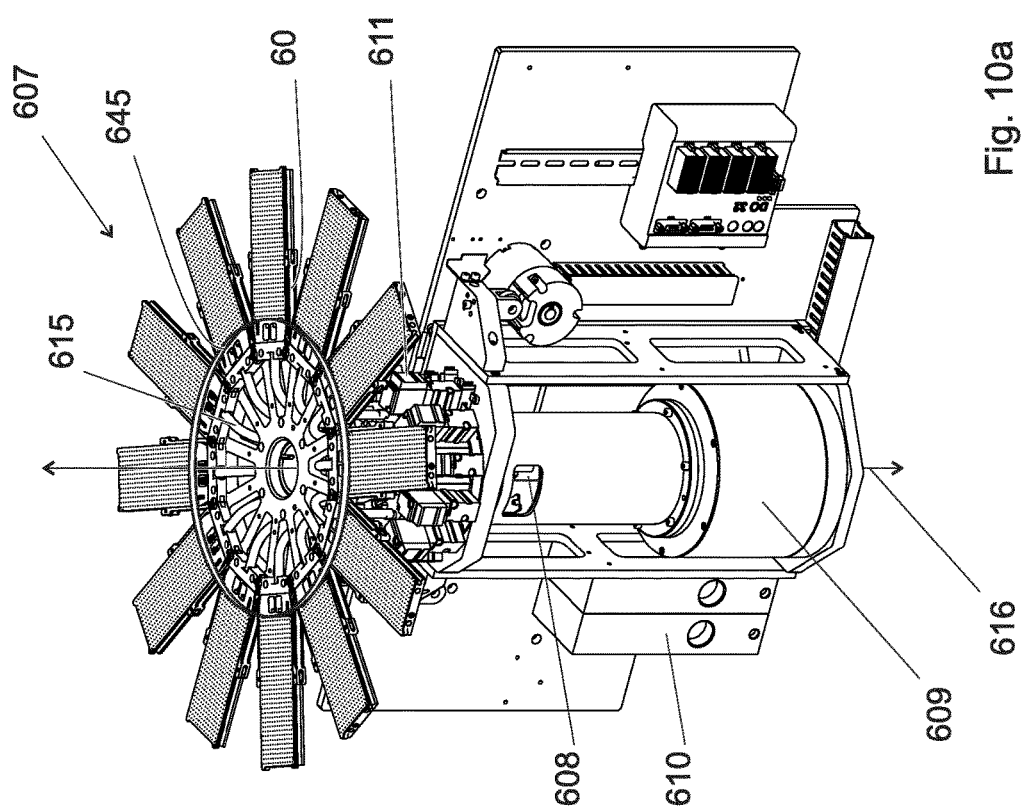

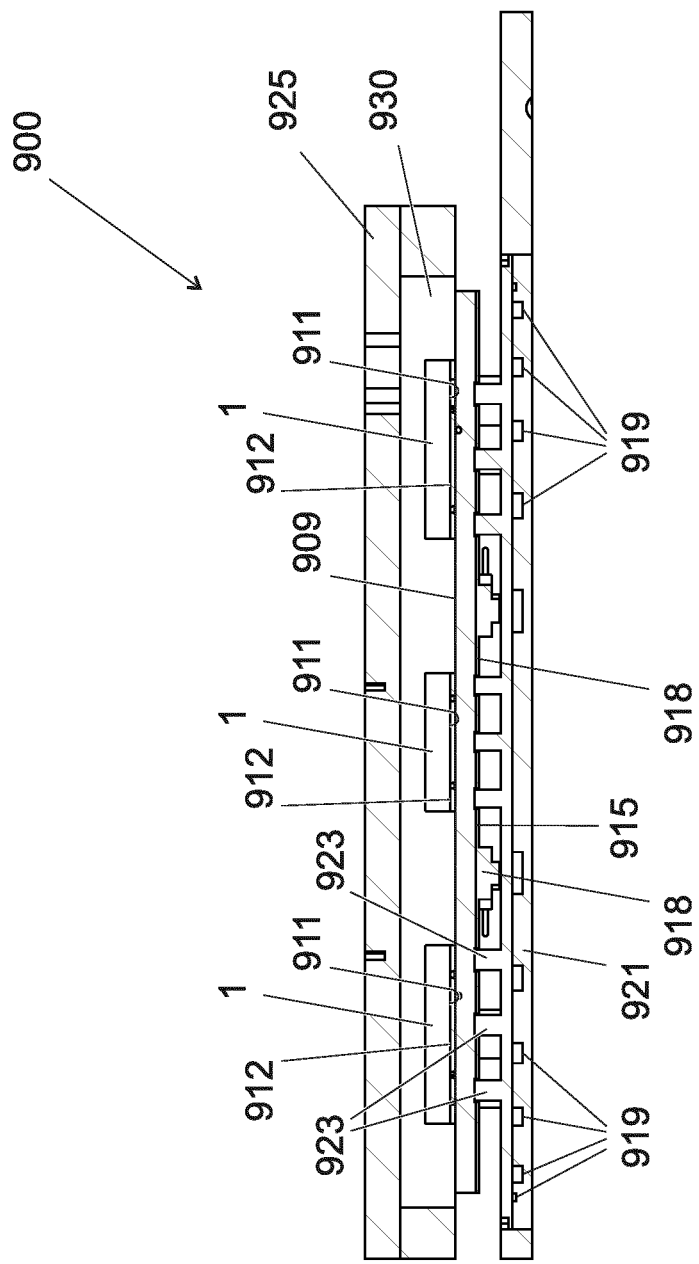

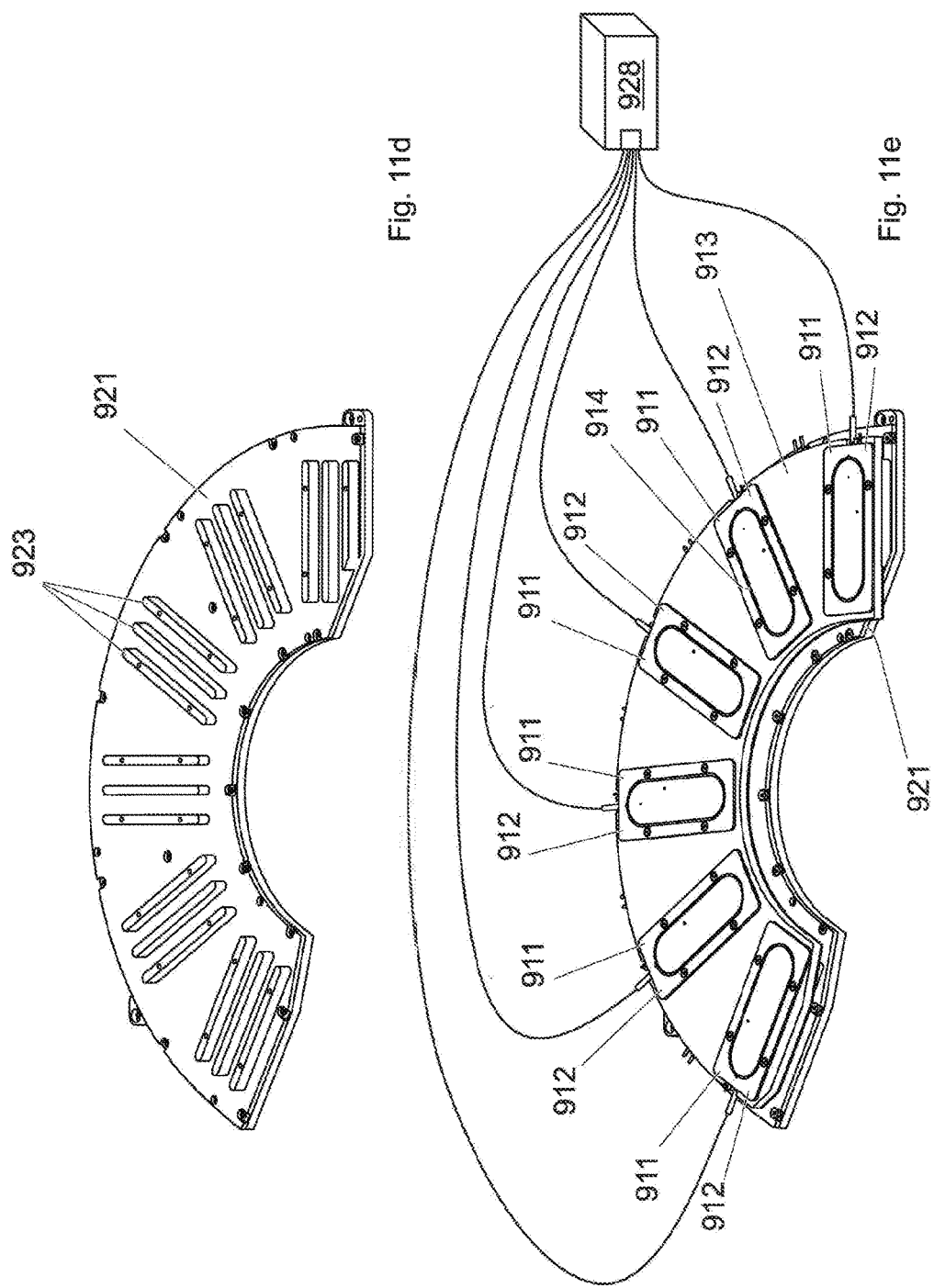

BOAT, ASSEMBLY AND METHOD FOR HANDLING ELECTRONIC COMPONENTS

RELATED APPLICATION

This application is a national phase of PCT/EP2015/061613, filed on May 26, 2015. The entire content of that application is hereby incorporated by reference.

FIELD OF THE INVENTION

The present invention concerns boat for carrying electronic components, wherein the boat has a surface having holes defined therein, on which a plurality of electronic components can be supported, and wherein the boat further comprises a first and second vacuum inlet each of which is in fluid communication with the holes and which can be simultaneously connected to respective first and second vacuum generating means. There is further provided a corresponding method of handling components which uses the boat and a component handling assembly which comprises one or more of the boats.

Description of Related Art

Electronic components are typically transported in a processing assembly using carriers such as boats. The electronic components to be transported are loaded on the surface of the boat at a loading area, and the boat then transports the loaded components once full.

In existing solutions the surface on the boat on which the electronic components are loaded has holes defined therein. The boats have a single vacuum inlet, which is in fluid communication with the holes, and which is connected to a vacuum generating means at the loading area. During the loading of the components onto the surface of the boat the vacuum generating means generates a vacuum at the holes. The vacuum holds the electronic components on the surface of the boat during loading.

However after the electronic components have been loaded the boat is transported from the loading area to another processing station. Typically the electronic components are mechanically held by a holders or recesses (such as nests) on the boat as the boat is transported. The holders which mechanically hold the electronic components on the boat provide unreliable performance (for example they do not hold electronic components in the position in which they were originally placed on the boat) and often components become displaced during transport Moreover there is an increased risk of components becoming displaced from the boat during handover i.e. as a boat begins its transport from the loading area to the next processing station, or as the boat is ending its transport and is being received into next processing station.

It is an aim of the present invention to obviate or mitigate at least some of the above-mentioned disadvantages.

BRIEF SUMMARY OF THE INVENTION

According to the invention, there is provided a boat which comprises, a surface on which a plurality of electronic components can be supported, the surface having a plurality holes defined therein through which a vacuum can be passed to hold components on the surface; and a first vacuum inlet which is in fluid communication with the plurality of holes, wherein the first vacuum inlet can be fluidly connected to a first vacuum generating means so that the first vacuum generating means can provide a vacuum at the plurality of holes; a second vacuum inlet which is in fluid communication with the same plurality of holes with which the first vacuum inlet is in fluid communication with, wherein the second vacuum inlet can be fluidly connected to a second vacuum generating means so that the second vacuum generating means can provide a vacuum at the plurality of holes.

The boat may further comprise, a single vacuum chamber which is provided below the surface of the boat; wherein each of the plurality holes is in fluid communication with the single vacuum chamber; and wherein the first vacuum inlet and the second vacuum inlet are each in fluid communication with said single vacuum chamber.

Preferably each of the plurality of holes have a diameter of between 50-200 μm. Preferably each of the holes will have a round cross section. Preferably the distance between consecutive holes will be between 1 to 4 mm.

In one embodiment the surface of the boat may comprise porous Aluminium. Preferably the pore size of the porous Aluminium will be between 5-50 μm.

The first vacuum inlet may be configured such that it can be selectively fluidly connected to the first vacuum generating means so that the first vacuum generating means can provide a vacuum at the plurality of holes. The second vacuum inlet maybe configured such that it can be selectively fluidly connected with an output of a second vacuum generating means such that the second vacuum generating means can provide a vacuum said plurality of holes.

Preferably the first and second vacuum inlets are configured such that they can be simultaneously connected to respective first and second vacuum generating means so that the first and second vacuum means simultaneously provide a vacuum at the same holes on the surface of the boat.

Preferably the second generating means is integral to a rotatable table which is configured to rotate to transport one or more of said boats.

Preferably the first generating means is integral to an assembly in which components are loaded onto the boat. Preferably the first generating means is configured such that it can provide a vacuum at said plurality of holes as the boat is being transported from the assembly to the rotatable table.

Preferably the boat further comprises a first and second check valve, wherein the first check valve is arranged to be in fluid communication with the first vacuum inlet and the second check valve is arranged to be in fluid communication with the second vacuum inlet.

Preferably the first check valve is arranged to be between the first vacuum inlet and the single vacuum chamber and the second check valve is arranged to between the second vacuum inlet and the single vacuum chamber. Preferably the first check valve is arranged at an output of the first vacuum inlet and the second check valve is arranged at an output of the second vacuum inlet.

Preferably the boat further comprises a tracks located along opposite sides of the boat which can cooperate with projections and/or wheels provided on a gripper, so as to guide the gripper to a predefined position between opposing arms of the gripper, as the gripper is being moved to hold the boat.

Preferably the boat is configured to have a cuboid shape. Preferably the tracks will be located along opposing longest sides of the cuboid shape.

It will also be understood that the boat may alternatively comprise projections located at opposite sides of the boat which can cooperate with tracks provided on a gripper which can hold the boat.

According to a further aspect of the present invention there is provided a method of handling electrical components, using a boat according to any one of the preceding claims, the method comprising the steps of, fluidly connecting the first vacuum inlet on the boat with a first vacuum generating means so that the first vacuum generating means is in fluid communication with the plurality of holes; generating a vacuum at the plurality of holes using exclusively the first vacuum generating means; placing a plurality of components on the surface of the boat as the first vacuum generating means exclusively generates a vacuum at the plurality of holes; fluidly connecting second vacuum generating means to the second vacuum inlet, while the first vacuum inlet is fluidly connected to the first vacuum inlet, so that the second vacuum generating means and first vacuum generating means simultaneously provides a vacuum at the plurality of holes; stopping the fluid communication between the first vacuum inlet on the boat and a first vacuum generating means so that a vacuum at the plurality of holes is generated by the second vacuum generating means exclusively.

The method may further comprise the steps of, transporting the boat from a location where the components are placed on the surface of the boat, to another location, and generating a vacuum at the plurality of holes using the first vacuum generating means exclusively, as the boat is being transported.

Preferably the method comprises the step of transporting the boat from a location where the components are placed on the surface of the boat, to a location where the boat is held by a gripper.

Most preferably the method comprises the step of transporting the boat from a location where the components are placed on the surface of the boat, to a rotatory table which comprises grippers which can grip the boat to transport the boat between a plurality of temperature control station at which the temperature of the boat and/or components is adjusted. It will be understood that the boat could be transported to any suitable location; e.g. the boat could be transported to a location where the components on the boat are tested i.e. a testing station.

The method may comprise the steps of, positioning the boat onto a surface of a means for transporting the boat, which is operable to transport the boat from a location where components can be placed on the surface of the boat, to a location where the boat can be held by a gripper. The step of positioning the boat onto a surface of the means for transport comprises positioning the boat onto a surface of the means for transport to fluidly connect the first vacuum inlet on the boat with a first vacuum generating means. Preferably the method comprises the step of moving the boat, using the means for transport, into a loading area; where in a loading area is an area where components can be placed by component handling heads on a rotatable turret, onto the surface of the boat supported on the means for transport. Preferably the step placing a plurality of components on the surface of the boat as the first vacuum generating means exclusively generates a vacuum at the plurality of holes comprises, placing each of the plurality of components consecutively on the surface of the boat using a component handling heads provided on a rotatable turret.

The step of fluidly connecting second vacuum generating means to the 20 second vacuum inlet may comprise, receiving the boat into a gripper which has a conduit which is fluidly connected to the second vacuum generating means and wherein the conduit is positioned in the gripper such that when the boat is received into the gripper the conduit will be fluidly connected to the second vacuum inlet of the boat.

The gripper may be provided on a rotary table, and wherein the method may further comprise the steps of, transporting the boat between a plurality of temperature control stations, by rotating the rotary table; and adjusting the temperature of the boat using heating means and/or cooling means, when the boat is located in each of the temperature control stations.

Preferably the second vacuum generating means is integral to the rotatable table.

The method may further comprise the step of, applying a vacuum to the boat when it is positioned in a temperature control station so as to reduce the air interface between the boat and temperature control station thereby increasing thermal conduction between the boat and heating means and/or cooling means. Preferably the vacuum is applied to an under-surface/bottom surface of the boat. Preferably the temperature control station comprises a platform on which the boat can be supported; the temperature of the platform is adjustable using cooling or heating means which are arranged in thermal communication with the platform; when the boat is supported on the platform the temperature of the platform is adjusted to a suitable temperature to achieve heating or cooling of the boat which is supported on the platform. The vacuum applied to the boat pulls the boat towards the platform. This will in turn reduce the air-interface between the boat and the platform so as to improve thermal conduction between the platform and boat.

Preferably the vacuum which is applied to the boat when the boat is positioned in a temperature control station is generated by a third vacuum generating means. Alternatively an independent vacuum generating means may be provided for each temperature control station so that the vacuum which is applied to the boat when the boat is positioned in each temperature control station is generated by a respective vacuum generating means.

According to a further aspect of the present invention there is provided a component handling assembly comprising, one or more of any of the above-mentioned boats.

The assembly may further comprise, a first vacuum generating means which can be fluidly connected to the first vacuum inlet on the boat so that the first vacuum generating means is in fluid communication with the plurality of holes; a means for placing a plurality of components on the surface of the boat as the first vacuum generating means exclusively generates a vacuum at the plurality of holes; second vacuum generating means which can be fluidly connecting to the second vacuum inlet, while the first vacuum inlet is fluidly connected to the first vacuum inlet, so that the second vacuum generating means and first vacuum generating means can simultaneously provide a vacuum at the plurality of holes.

The assembly may further comprise, a means for transporting the boat from a location where the components are placed on the surface of the boat, to another location, and wherein the first vacuum generating means is configured so that it can generate a vacuum at the plurality of holes using the first vacuum generating means exclusively, as the boat is being transported.

Preferably said means for placing a plurality of components on the surface of the boat comprises a rotatable turret which comprises a plurality of component handling heads each of which can hold a component.

The assembly may further comprise a loading area into which a boat can be received, where the first vacuum inlet on the boat can be fluidly connected with the first vacuum generating means and where components can be loaded onto the surface of the boat by handling heads on the turret.

The assembly may further comprise, a rotatable table having a plurality of grippers each of which can hold a boat; and wherein each gripper has a conduit defined therein which is fluidly connected to the second vacuum generating means and is positioned in the gripper such that when the boat is held by the gripper the conduit will be fluidly connected to the second vacuum inlet.

Preferably the second vacuum generating means is integral to the rotatable table.

Preferably each gripper further comprises projections which can cooperate with tracks located along opposite sides of the boat so as to guide the gripper as the gripper is being moved to hold the boat.

Preferably the means for transporting the boat is configured to move a boat into a gripper so that the boat is held by the gripper.

The assembly may further comprise, a platform having a plurality of temperature control stations defined therein each of which can receive a boat; and a heating and/or cooling means, which is arranged to be in thermal communication with the plurality of temperature control stations, for adjusting the temperature of boats which are located in a respective temperature control station.

Preferably, each temperature control station comprises a platform which is comprises thermally conductive material. Below the thermally conductive platform of each temperature control station there may be provided a heating and/or cooling means arranged to be in thermal communication with the thermally conductive platform.

Preferably the rotatable table is arranged such that it can move a boat between temperature control stations.

The cooling means may comprise any suitable cooling liquid and/or cooling gas which has a temperature below ambient temperature. For example the cooling means may comprise a cooling liquid and/or cooling gas which has a temperature between ambient temperature and −150°. Preferably the cooling means comprises nitrogen gas. Preferably the heating means comprises a plurality of heating elements, wherein each of the plurality of heating elements can be selectively operated.

The assembly may further comprise, a third vacuum generating means which is fluidly connected to one or more temperature control stations such that it can apply a vacuum to boat(s) positioned in the or each temperature control station, so as to reduce the air interface between the boat(s) and the temperature control station, thereby increasing thermal conduction between the boat and heating means and/or cooling means.

Each temperature control station may comprises a platform base which is defined by a thermally conductive layer. The third vacuum generating means may be configured such that it can apply a vacuum force to a boat which is located in a respective temperature control station to pull the boat towards the surface of the thermally conductive platform so as to reduce the air interface between the boat and the surface of the thermally conductive platform, thereby increasing thermal conduction between the boat and heating means and/or cooling means.

BRIEF DESCRIPTION OF THE DRAWINGS

The invention will be better understood with the aid of the description of an embodiment given by way of example and illustrated by the figures, in which:

FIG. 1a provides a perspective view of a boat according to an embodiment of the present invention;

FIG. 1b provides a magnified view of a first vacuum inlet and second vacuum inlet of the boat 1 shown in FIG. 1a;

FIG. 2 provides a longitudinal section view of part of the boat in FIG. 1a;

FIG. 3b provides a perspective view of the support layer of the boat in FIGS. 1a,1b,2 and 3a.

FIG. 10a provides a perspective view of the rotatable table used in the assembly of FIG. 7;

FIG. 10b provides a perspective view of a gripper of the rotatable table of FIG. 10a;

FIG. 11b provides a cross section of the temperature management system, taken along line 'A-B' shown in FIG. 11a;

FIG. 11d provides a perspective view of a portion of the plate member of the temperature management system; Figure lie provides a perspective view of a portion of the annular plate of the temperature management system;

DETAILED DESCRIPTION

Figure 1B:
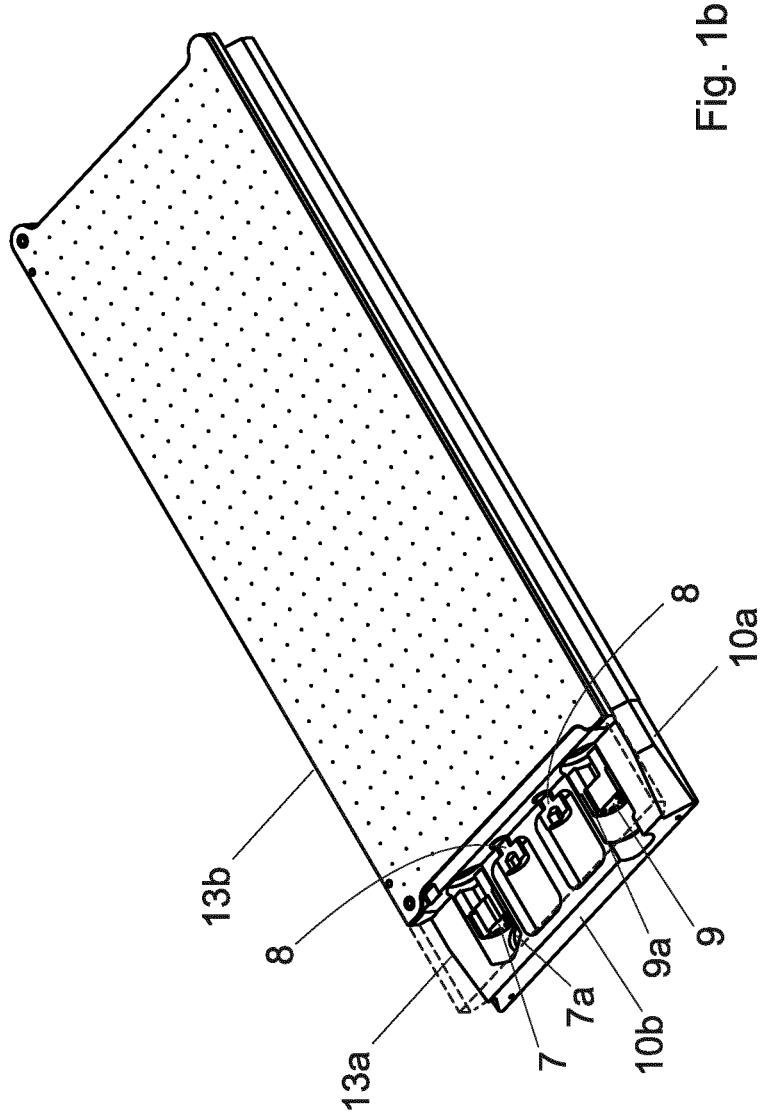

FIG. 1a provides a perspective view of a boat 1 according to an embodiment of the present invention. The boat comprises, a surface 3 on which a plurality of electronic components (not shown) can be supported. The surface 3 has a plurality holes 5 defined therein through which a vacuum can pass to hold components on the surface 3.

The boat 1 further comprises a tracks 55 provided along opposite sides 57a,57b of the boat 1 (only the track 55 on side 57a is visible in FIG. 1a). The tracks 55 will be described in more detail below.

A first vacuum inlet 7 is provided in fluid communication with the plurality of holes 5. The first vacuum inlet 7 can be selectively fluidly connected to a first vacuum generating means that the first vacuum generating means can provide a vacuum at the plurality of holes 5. In this example the first vacuum inlet 7 is configured to have an input 7a located at an under-surface 10a of the boat 1.

A second vacuum inlet 9 is provided in fluid communication with the same plurality of holes 5 with which the first vacuum inlet 7 is in fluid communication. The second vacuum inlet 9 can be selectively fluidly connected to a second vacuum generating means so that the second vacuum generating means can provide a vacuum at the plurality of holes 5. In this example the second vacuum inlet 9 is configured to have an input 9a located at a front-surface 10b of the boat 1.

FIG. 1b provides a magnified view of the first vacuum inlet 7 and second vacuum inlet 9 of the boat 1 shown in FIG. 1a and like features are awarded the same reference numbers. The first vacuum inlet 7 is shown to have an input 7a located at an under-surface 10a (a portion of the boat is shown as transparent so that the input 7a is visible). The second vacuum inlet 9 is configured to have an input 9a located at a front-surface 10b of the boat 1.

During a component handling process, for example, the first vacuum inlet 7 may be fluidly connected to a first vacuum generating means and the second vacuum inlet 9 may be simultaneously fluidly connected to a second vacuum generating means, so that the first vacuum generating means and second vacuum generating means simultaneously provide a vacuum at the same plurality of holes 5. At other stages in the component handling process only the first vacuum inlet 7 may be fluidly connected to a first vacuum generating means (and the second vacuum inlet 9 is not fluidly connected to the second vacuum generating means) so that the vacuum at the hole 5 is provided exclusively by the first vacuum generating means, and/or only the second vacuum inlet 9 may be fluidly connected to a second vacuum generating means (and the first vacuum inlet 7 is not fluidly connected to the first vacuum generating means) so the vacuum at the holes 5 is provided exclusively by the second vacuum generating means. An example of such a component handling process will be described in more detail later.

Figure 2:
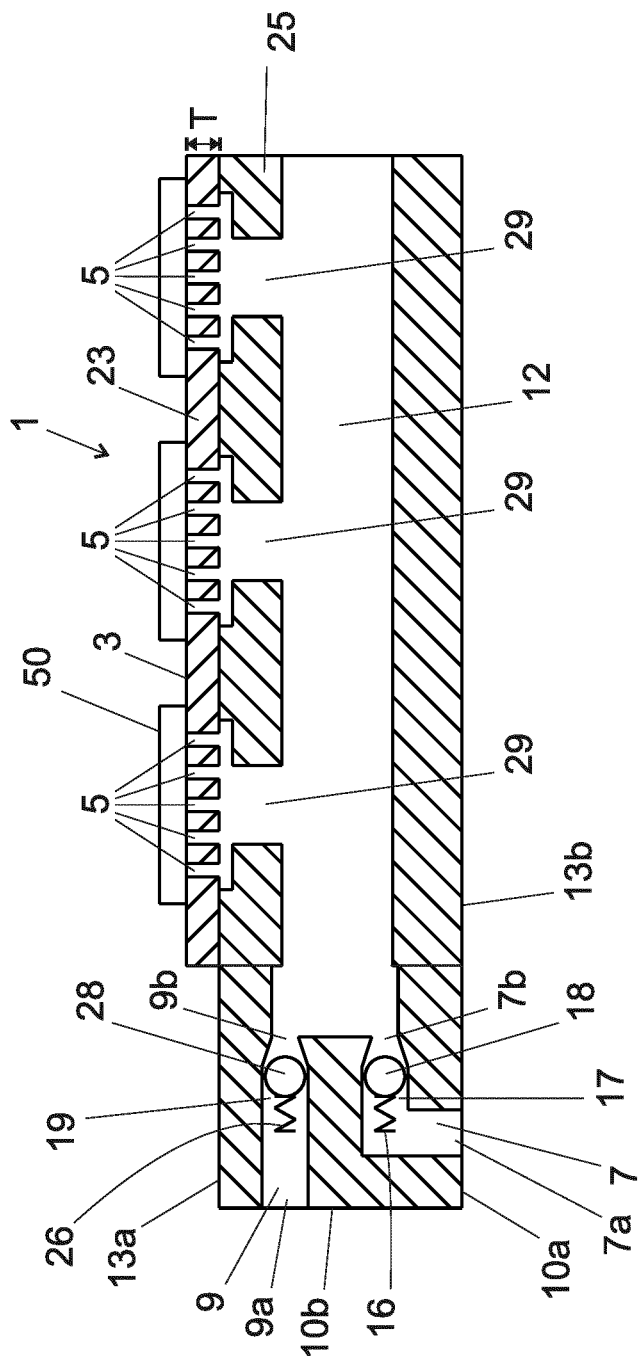

FIG. 2 provides a simplified longitudinal section view of part of the boat 1 in FIG. 1a and like features are awarded the same reference numbers. FIG. 2 illustrates a plurality of electronic components 50 supported on the surface 3 of the boat 1.

It can be seen that the boat 1 comprises a single vacuum chamber 12 which is in fluid communication with the holes 5 defined in the surface 3. The first vacuum inlet 7 and the second vacuum inlet 9 are each in fluid communication with said single vacuum chamber 12.

A first check valve 17 is arranged between the input 7a and an output 7b of first vacuum inlet 7 and the second check valve 19 is arranged between the input 9a and output 9b of the second vacuum inlet 9. The first check valve 17 is operable to control the fluid flow (such as the flow of vacuum) from the first vacuum inlet 7 into the single vacuum chamber 12 and the second check valve 19 is operable to control the fluid flow (such as the flow of vacuum) from the second vacuum inlet 9 into the single vacuum chamber 12. The first check valve 17 comprises a first biasing means in the form of a first spring 16 which biases a first plug member 18 towards plugging the output 7b of first vacuum inlet 7. The first plug member 18 is configured such that it will prevent fluid communication between the first vacuum inlet 7 and the single vacuum chamber 12 when it plugs the output 7b of the first vacuum inlet 7. The first plug member 18 is movable, by providing a vacuum in the first vacuum inlet 7, to become unplugged from the output 7b to allow fluid communication (e.g. a vacuum) between the first vacuum inlet 7 and the single vacuum chamber 12. The second check valve 19 comprises a second biasing means in the form of a second spring 26 which biases a second plug member 28 towards plugging the output 9b of the second vacuum inlet 9. The second plug member 28 is configured such that it will prevent fluid communication between the second vacuum inlet 9 and the single vacuum chamber 12 when it plugs the output 9b of the second vacuum inlet 9. The second plug member 28 is movable, via vacuum in the second vacuum inlet 9, to become unplugged from the output 9b to allow fluid communication (e.g. a vacuum) between the second vacuum inlet 9 and the single vacuum chamber 12. In the example illustrated in FIG. 2 the first and second plug members 18,28 are shown as ball-shaped members, however it will be understood that the first and second plug members 18,28 may take any suitable shape, configuration or design which will enable the plug members 18,28 to prevent fluid communication through the respective outputs 7b,9b when biased by the respective springs 16,26 to plug the outputs 7b,9b. Likewise the first and second biasing means are shown to be in the form of springs 16,26 however it will be understood that any suitable biasing means may be used.

In this example the boat 1 is configured to be modular, comprising a first modular piece 13a which comprises the first vacuum inlet 7 and second vacuum inlet 9 and a second modular piece 13b which comprises the surface 3 which has a plurality holes 5 and a single vacuum chamber 12 (FIG. 1 also illustrated the first and second modular pieces 13a,13b); the first modular piece 13a is shown in cross section in FIGS. 1a and 1b for clarity. As shown in FIG. 1 the first and second modular pieces 13a,13b are attached to one another via fasteners 8.

In the exemplary embodiment shown in FIG. 2 the surface 3 is defined by a metal layer 23. Preferably metal layer 23 has a thickness 'T' of between 0.3 mm-2 mm; and preferably the metal layer 23 comprises sheet metal. The metal layer 23 may comprise any suitable material such as aluminium alloys, steel, copper alloys, glass, silicon, for example. The holes 5 are defined in the metal layer 23. Preferably the holes 5 are formed in the metal layer 23 by drilling or etching. The metal layer 23 has a planar profile.

As illustrated in FIG. 2 the surface 3 on which the plurality of electronic components 50 is supported has a planar profile or a substantially planar profile. The surface 3 does not extend above a plane of the components 50 which are supported on the surface 3. This is in contrast to the boats of the prior art which comprise cavities defined in their surface; each of the cavities being dimensioned so that it can receive a respective component; each cavity is dimensioned to receive a component of a specific dimension, accordingly different boats need to be used to carry different components of different dimensions: For example in the prior art a boat having cavities with length 0.4 mm, width 0.4 mm and depth of 1.3 mm can be used to support components of dimensions 0.6 mm*0.3 mm*0.3 mm (i.e. 0.6 mm in thickness; 0.3 mm in length; and 0.3 mm in width); however such a boat would not be suitable to support components of dimensions 0.8 mm*0.5 mm*0.5 mm (i.e. 0.8 mm in thickness; 0.5 mm in length; and 0.5 mm in width) since the components would not fit into the respective cavities provided on the boat; accordingly a second, different, boat having cavities with length 0.6 mm, width 0.6 mm and depth of 1.3 mm for example is required to support components of dimensions 0.8 mm*0.5 mm*0.5 mm. Thus in the prior art different boats must be used depending on the dimensions of the components to be supported. Advantageously in the present invention the surface 3 on which the plurality of electronic components 50 is supported has a planar profile or a substantially planar profile; this allows components of various dimensions and shapes to be supported on the surface 3 and allows the components to be placed in various patterns on the surface 3. The boat of the present invention is not restricted to support components of a specific dimension; specifically unlike the boats of the prior art the boat of the present invention is not restricted to support only components which can fit within cavities provided on the surface of the boat.

The boat 1 further comprises a support layer 25 on which the metal layer 23 is mounted. The support layer 25 provides mechanical support to the metal layer 23. The support layer 25 has a plurality of conduits 29 defined therein; the conduits 29 are configured to fluidly connect one or more holes 5 in the metal layer 23 with the single vacuum chamber 12. In the example illustrated in FIG. 2 each conduit 29 fluidly connects five holes 5 in the metal layer 23 with the single vacuum chamber 12; however it will be understood the conduits 29 may be configured to fluidly connect any number of holes 5 with the single vacuum chamber 12, for example each conduit 29 may be configured to fluidly connect a single hole 5 with the single vacuum chamber 12.

Preferably the support layer 25 comprises material with a conductivity above 40 W/(m K) advantageously this facilitates heat transfer from beneath the boat 1 (e.g. from the under-surface 10*a* of the boat 1) to electronic components 50 supported on the surface 3 of the boat 1. Most preferably the support layer 25 comprises aluminium alloys, steel, copper alloys.

Figure 3A:
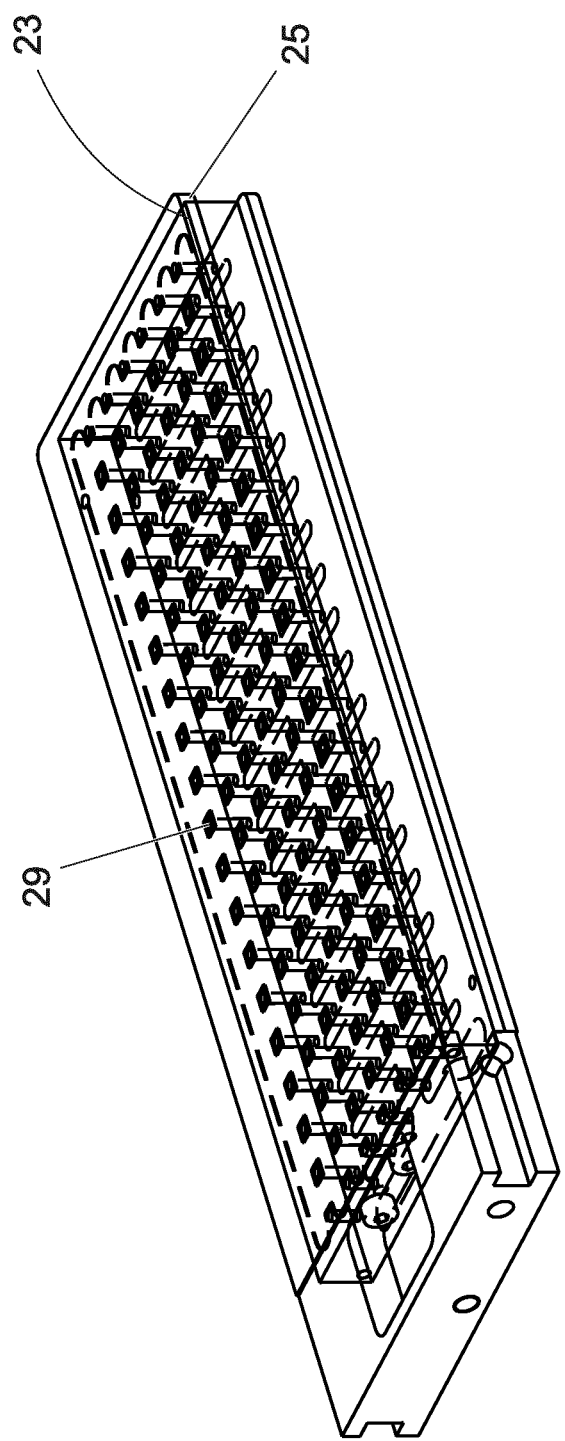
FIG. 3a provides a perspective view of the boat shown in FIGS. 1a,1b and 2 with a metal layer of the boat illustrated as transparent to reveal a support layer.
Figure 3B:
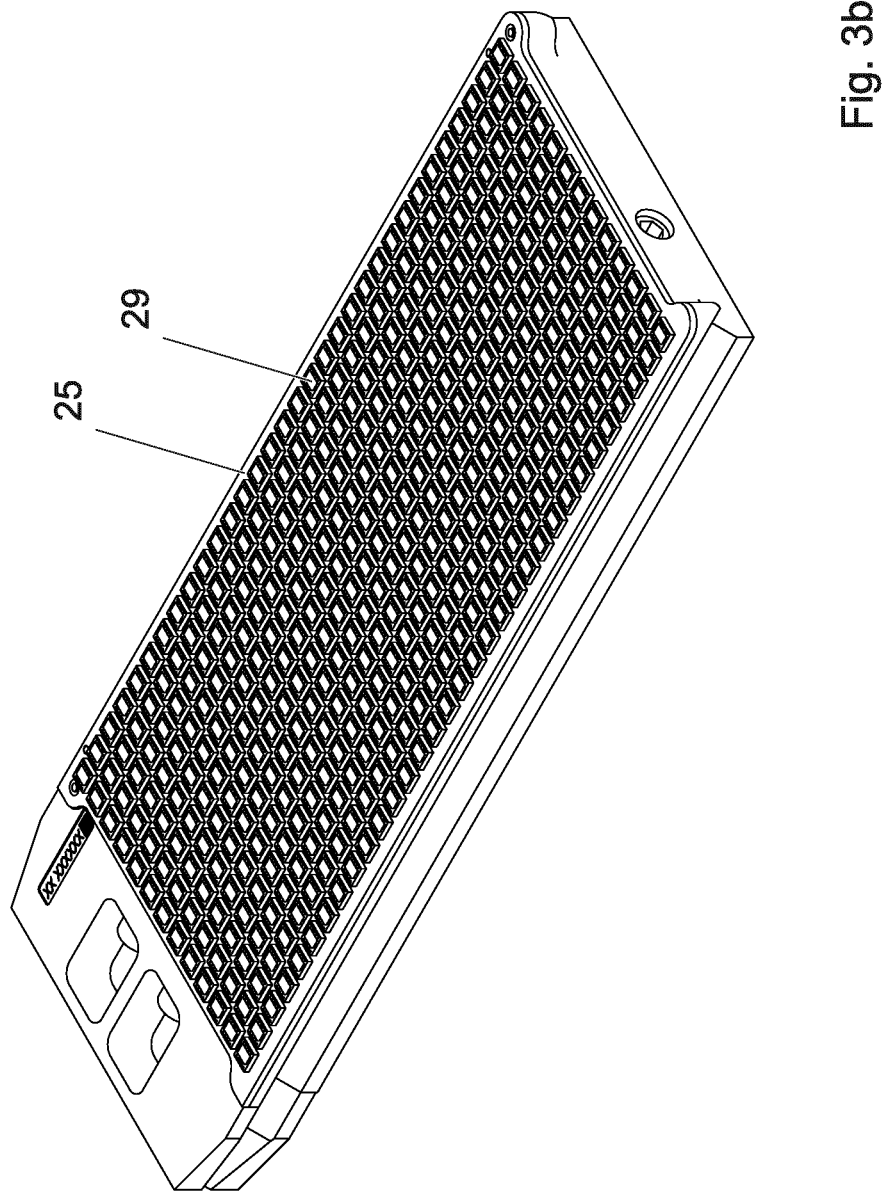

FIG. 3*a* provides a perspective view of the boat 1 shown in FIGS. 1*a,b* and 2 with the metal layer 23 illustrated as transparent to reveal the support layer 25 and like features are awarded the same reference numbers. FIG. 3*b* provides a perspective view of the support layer 25. As can be seen in FIGS. 3*a* and 3*b* the conduits 29 are each configured to have a quadrilateral cross-section (preferably the conduit 29 are each configured to have a square cross-section); however it will be understood that the conduits 29 may take any suitable shape, design or configuration, for example the conduits may have a circular cross-section.

Figure 4:
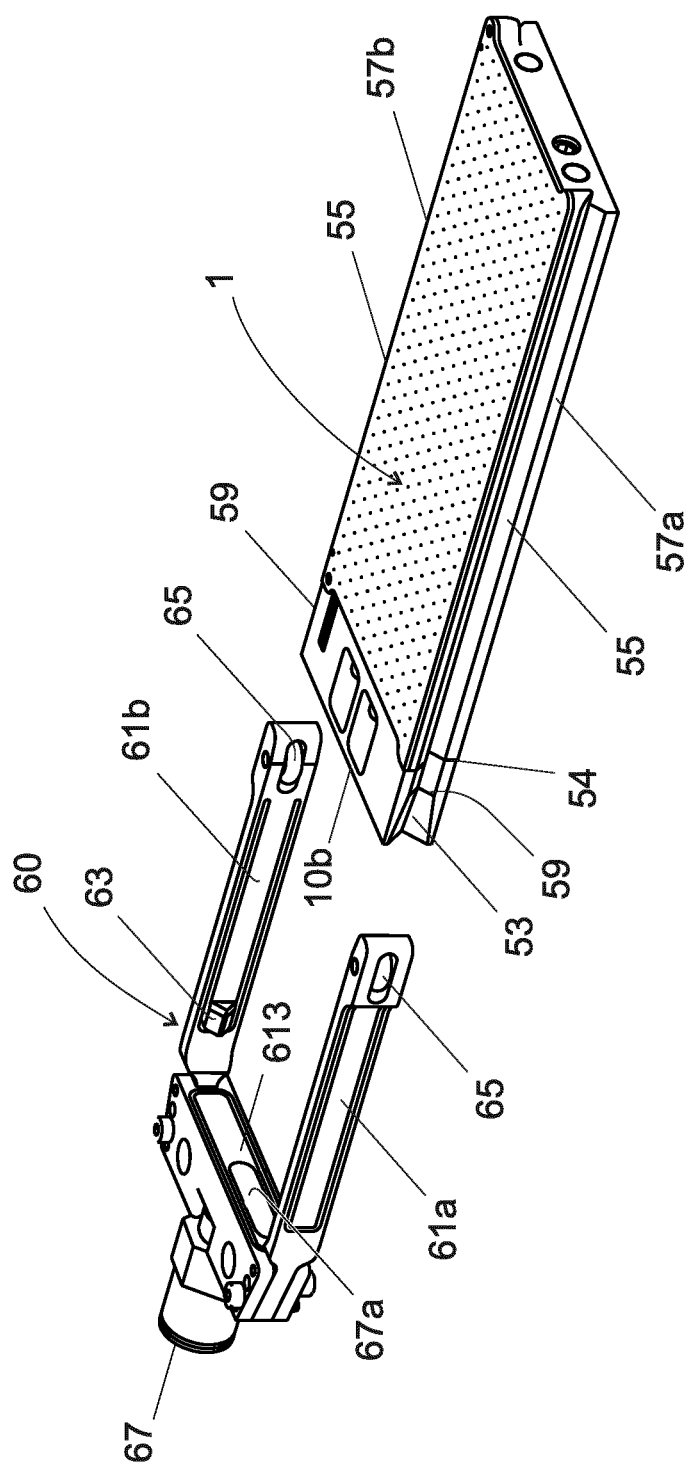
FIG. 4 provides a perspective view of the boat of FIGS. 1a,1b,2 and 3a and also provides a perspective view of a gripper which can hold the boat.

As mentioned the boat 1 further comprises a tracks 55 provided along opposite sides 57*a*,57*b* of the boat 1. FIG. 4 provides a perspective view of the boat 1 of FIGS. 1-3 and like features are awarded the same reference numbers, and also provides a perspective view of a gripper 60 which can hold the boat 1.

The boat 1 is configured to have a cuboid shape. In this example the boat 1 has a rectangular shape and the tracks 55 are located along opposing longest sides 57*a*,57*b* of the boat 1. In this example each track 55 is configured to have a v-shaped cross section; however it will be understood that the tracks 55 may have any suitable shape, design or configuration. Each track 55 can cooperate with projections 63 and/or wheels 614 (and/or ball bearings) provided on opposing arms 61*a,b* of the gripper 60, so that the boat 1 is guided into the correct (predefined) position between opposing arm 61*a,b* of the gripper 60, as the boat 1 is moved in a direction towards the gripper 60, between its opposing arms 61*a,b*. Specifically as the boat 1 is moved towards the gripper 60, between the opposing arms 61*a,b* of the gripper 60, initially the wheels 614 on opposing arms 61*a,b* are received into the tracks 55 of the boat 1 and move along the tracks 55 as the boat 1 continues to be moved towards the gripper 60; eventually the projections 63 are received into the tracks 55 of the boat 1 and move along the tracks 55 as the boat 1 continues to be moved towards the gripper 60; the wheels 614 and projections 63 maintain correct positioning of the boat 1 between the opposing arms 61*a,b*.

The boat 1 further comprises a mouth portions 59 provided at opposite sides 57*a*,57*b* of the boat 1. Each mouth portion 59 has a tapered channel 53 defined therein. Each mouth portion 59 is arranged such that the widest end of its tapered channel 53 is located at the front-surface 10*b* of the boat 1 and the tapered channel 53 tapers, in a direction from the front-surface 10*b* towards a respective track 55, to have dimensions corresponding to the dimensions of the respective track 55. Thus the narrowest end of the tapered channel 53 has dimensions equal to the dimensions of a respective track 55 so that the tapered channel 53 matches the respective track 55 at an interface 54 between the mouth portion 59 and respective track 55. Advantageously the mouth portions 59 with their respective tapered channels 53 facilitate receiving the projections 63 and/or wheels 614 (and/or ball bearings) provided on the opposing arms 61*a,b* of the gripper 60 into the tracks 55 on the boat 1, as the boat 1 is moved towards the gripper 60 between the opposing arms 61*a,b* of the gripper 60.

In an alternative embodiment, instead of tracks 55, the boat 1 may alternatively comprise projections and/or wheels and/or ball bearings located on the opposite sides 57*a*,57*b* of the boat 1. In this case the gripper 60 may be provided with tracks which are configured to cooperate with the projections and/or wheels and/or ball bearings of the boat 1 so that the boat 1 is guided into the correct (predefined) position between opposing arm 61*a,b* of the gripper 60, as the boat 1 is moved towards the gripper 60 between the opposing arms 61*a,b* of the gripper 60.

The gripper 60 further comprises a conduit 67 defined therein which is fluidly connected to a second vacuum generating means. The conduit 67 passes through the gripper 60 to define a conduit mouth 67*a* located at an inner surface 613 of the gripper 60. The second vacuum inlet 9 on the boat 1 is configured such that position of the input 9*a* of the second vacuum inlet 9 corresponds to the position of the conduit mouth 67*a* when the boat 1 is held by the gripper 60. Thus when the boat 1 is held by the gripper 60 the conduit 67 in the gripper 60 will fluidly connect the second vacuum generating means with the second vacuum inlet 9 so that the second generating means can be selectively operated to provide a vacuum at the holes 5 on surface 3 of the boat 1.

Figure 5:
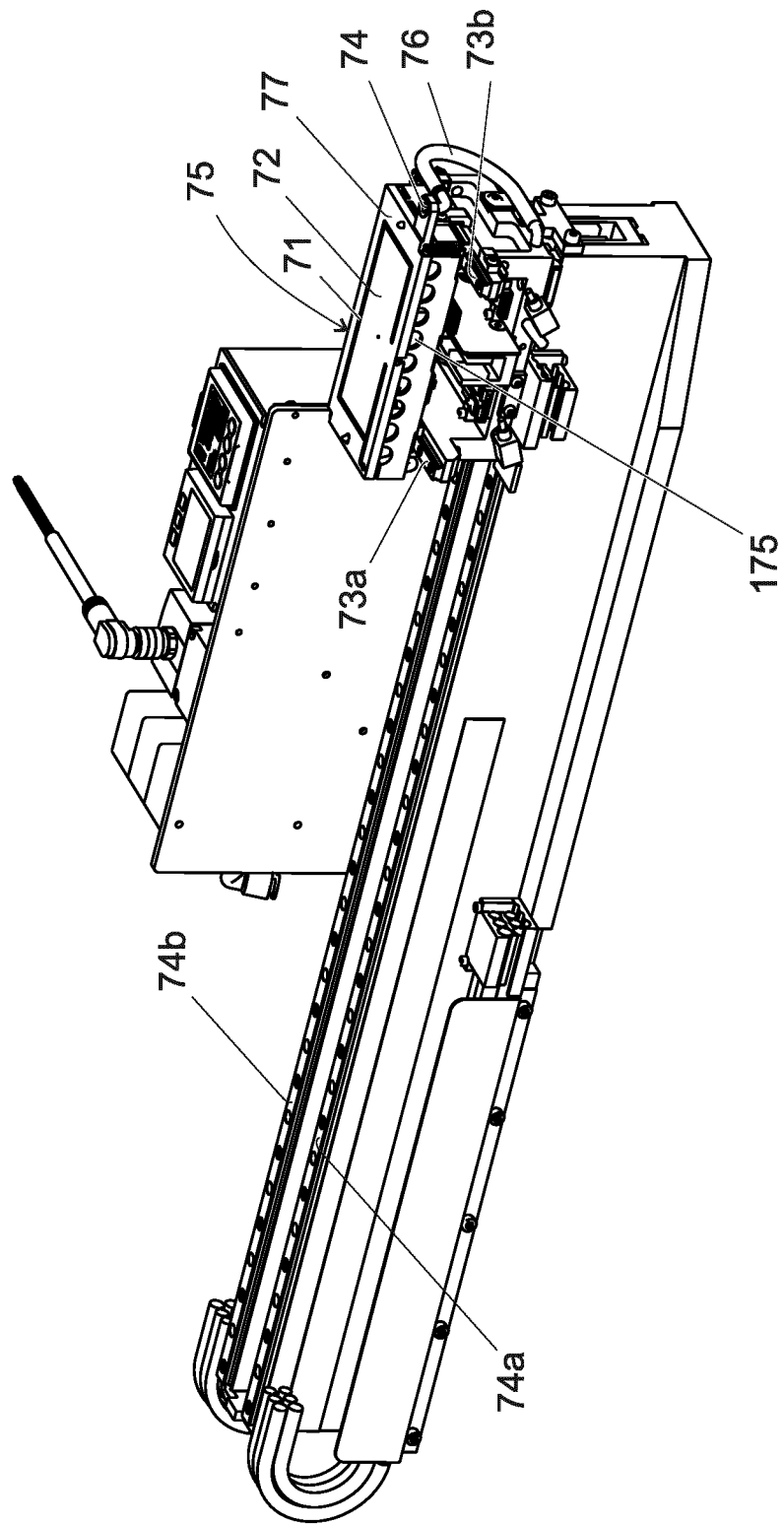
FIG. 5 provides a perspective view of an x-y table used in an assembly according to the present invention.

It should be further noted that boat 1 may be supported on and transported by a carrier 75 which defines a means for transporting the boat. The carrier 75 is used to move the boat 1 towards the gripper 60, between the opposing arms 61*a,b* of the gripper 60, so that the gripper 60 can hold the boat 1 and so as to fluidly connect the conduit 67 of the gripper 60 with the second vacuum inlets 9 in the boat 1. FIG. 5 illustrates an example of a carrier in the form of an x-y table 75. The x-y table 75 comprises a platform 77 having a surface 72 on which on which a boat 1 can be supported; the platform 77 can be moved in 2-dimensions via a first pair of rails 73*a,b* and a second pair of rails 74*a,b* which are arranged to extend perpendicular to one another. The x-y table 75 further comprises a conduit 76 which defines a conduit mouth 74 located at the surface 72 of the platform 77. The conduit 76 is fluidly connected to a first vacuum generating means. The input 7*a* of the first vacuum inlet 7 on the boat 1 is configured such that position of the input 7*a* of the first vacuum inlet 7 corresponds to the position of the conduit mouth 74 when the boat 1 is supported on the surface 72 of the platform 77. Thus when the boat 1 is supported on surface 72 of the platform 77 the conduit 76 will fluidly connect the first vacuum generating means with the first vacuum inlet 7 of the boat so that the first vacuum generator can be selectively operated to provide a vacuum at the holes 5 on surface 3 of the boat 1.

The carrier 75 further comprises a temperature control means which is operable to control the temperature of the platform 77 on which the boat 1 is supported. In this example the temperature control means is integral to the carrier 75 and so is not visible in FIG. 5. The temperature control means comprises a heating means which is adjustable to heat to the platform 77 to a predefined temperature; optionally the temperature control means can also include a cooling means which is adjustable to cool the platform 77 to a predefined temperature. The carrier 75 further comprises a thermal conduction barrier 175 which is configured to reduce thermal conduction between the platform 77 and the other parts of the carrier 75; the thermal conduction barrier 175 may take any suitable form (e.g. a thermal insulation layer); in this example the thermal conduction barrier 175 is defined by a series of cut-out sections 175, defined in the carrier 75 beneath the platform 77. In this example each cut-out section 175 has a semi-circular profile, however it will be understood that each cut-out section 175 could have any other suitable profile (e.g. triangular or rectangular. The cut-out sections 175 provide for a series of air gaps between the platform 77 and other parts of the carrier 75 which are positioned below the platform 77, which act to reduce thermal conduction between the platform 77 and the other parts of the carrier 75. Thus, advantageously, when the platform 77 is heated by the temperature control means, the cut-out sections 175 will prevent the heat in the platform 77 from being lost to the other parts of the platform 77.

The temperature control means in the carrier 75 can be used to preheat the boat 1 to a predefined temperature in preparation for testing and/or to maintain an already heated boat 1 at a predefined temperature. For example, as will be described in more detail later, the boat may need to be heated by a temperature management system, to a predefined temperature required for testing; the temperature control means in the carrier 75 can be used to pre-heat the boat 1 before it is supplied to the temperature management system so as to reduce the time required at the temperature management system to heat the boat to the predefined temperature required for testing. Moreover, advantageously, the temperature control means in the carrier 75 allows the boat 1 to be heated as it is being transported by the carrier 75, thus allowing both heating and transport of the boat to be carried out in parallel. Additionally the temperature control means in the carrier 75 can be used to maintain an already heated boat 1 at a predefined temperature; advantageously this will prevent the boat 1 from cooling to ambient temperature thereby reducing the heating energy required to reheat the boat 1 in subsequent processing steps.

For example consider that the boat 1 needs to have a predefined temperature of 155° C. before testing of the components 50 on the boat 1 is to be performed: The temperature control means in the carrier 75 may be adjusted to heat the platform 77 to a temperature of 80° C.; taking account of thermal losses, the platform 77 at 80° C. will heat a boat 1 which is supported on the platform 77 to a temperature of 75° C. for example; thus when the boat is introduced into the temperature management system it will already have been preheated to a temperature of 75° C. At the temperature management system the boat 1 can be heated to the temperature of 155° C. as required for testing. After the boat is heated to the temperature of 155° C. the components 50 on the surface 3 of the boat 1 are then tested. After testing is completed the boat 1 will still be at temperature of about 155° C.; the boat 1 may be cooled to a temperature of 75° C. at temperature management system, before the boat 1 is positioned back onto the platform 77 of the carrier 75. Since the platform 77 has a temperature of 80° C. the boat 1 will be maintained at the temperature of 75° C. when it is located on the platform 77, so that the boat 1 is prevented from cooling to ambient temperature.

The temperature control means in the carrier 75 also serves to reduce the thermal stresses which the boat 1 experiences. As the boat 1 is heated the boat expands which in turn induces stressed in the boat 1. Since the boat 1 is preheated by the temperature control means in the carrier 75 before it is passed to the temperature management system where it is heated to the predefined temperature required for testing, this reduces the temperature change which the boat 1 must undergo at the temperature management system. This in turn reduces the thermal stresses which the boat 1 experiences at the temperature management system.

Importantly a further advantage offered by the temperature control means in the carrier 75 is that it can be used to maintain the boat 1 at a predefined constant temperature during loading and unloading of components 50 onto/from the surface 3 of the boat 1. As mentioned the boat 1 expands in dimension if heated, and also contracts in dimension when cooled. To load components 50 onto the surface 3 of the boat 1, the carrier 75 moves the boat 1 in predefined fixed movements so that a predefined vacant position on the surface 3 of the boat 1 are presented under a component handling head so that the component handling head can place the component 50 which it holds onto the boat 1 at the presented predefined position. If the temperature of the boat 1 were to change during loading then, the change in dimension of the boat 1 would alter the distance between the predefined vacant positions on the surface 3; consequently the predefined fixed movements which the carrier 75 moves the boat 1 would no longer present the predefined vacant position on the surface 3 of the boat 1 under the component handling head. Consequently a position other than the predefined vacant position on the surface 3 of the boat 1 is presented under the component handling head; accordingly the component handling head will place the component at an incorrect position (i.e. a position other than the predefined vacant position) on the surface 3 of the boat 1. Similarly changes in temperature of the boat 1 during unloading of components 50 from the surface 3 of the boat 1 would mean that components 50 are no longer aligned under the component handling heads and thus cannot be picked by the component handling heads.

Thus the temperature control means in the carrier 75 can advantageously maintain the boat 1 at a predefined constant temperature during loading and unloading of components 50 onto/from the surface 3 of the boat 1 which allows for more accurate loading of components onto predefined positions on the surface 3 of the boat and for more reliable picking of components 50 from the surface 3 of the boat 1.

It should be noted that the predefined positions on the surface 3 of the boat 1 onto which the components 50 are loaded is selected such that when the boat 1 is heated to the predefined temperature required for testing, the components 50 are in desired predefined position required for testing. For example, if the boat 1 is to be heated to a predefined temperature of 155° C. before testing, and the temperature of the boat 1 is 75° C. during loading (due to temperature control means in the carrier 75), then the expansion of the dimensions of the boat 1 which will occur when the boat 1 is heated from 75° C. to 155° C. is taken into account when selecting the predefined positions on the surface 3 of the boat 1 onto which to load the components 50. For example, if the boat 1 (and consequently its surface 3) is expected to expand by 1 mm in length and 1 mm in width when heated from 75° C. to 155° C., then the components 50 are loaded to predefined positions on the surface 3 of the boat 1 which are, for example, 0.1 mm from predefined positions which the components 50 are to occupy for testing; this ensures that as the boat 1 expands when heated from 75° C. to 155° C., the components 50 are moved by 0.1 mm via the expansion of the boat 1 to the predefined positions which the components 50 are required to occupy for testing.

Figure 6:
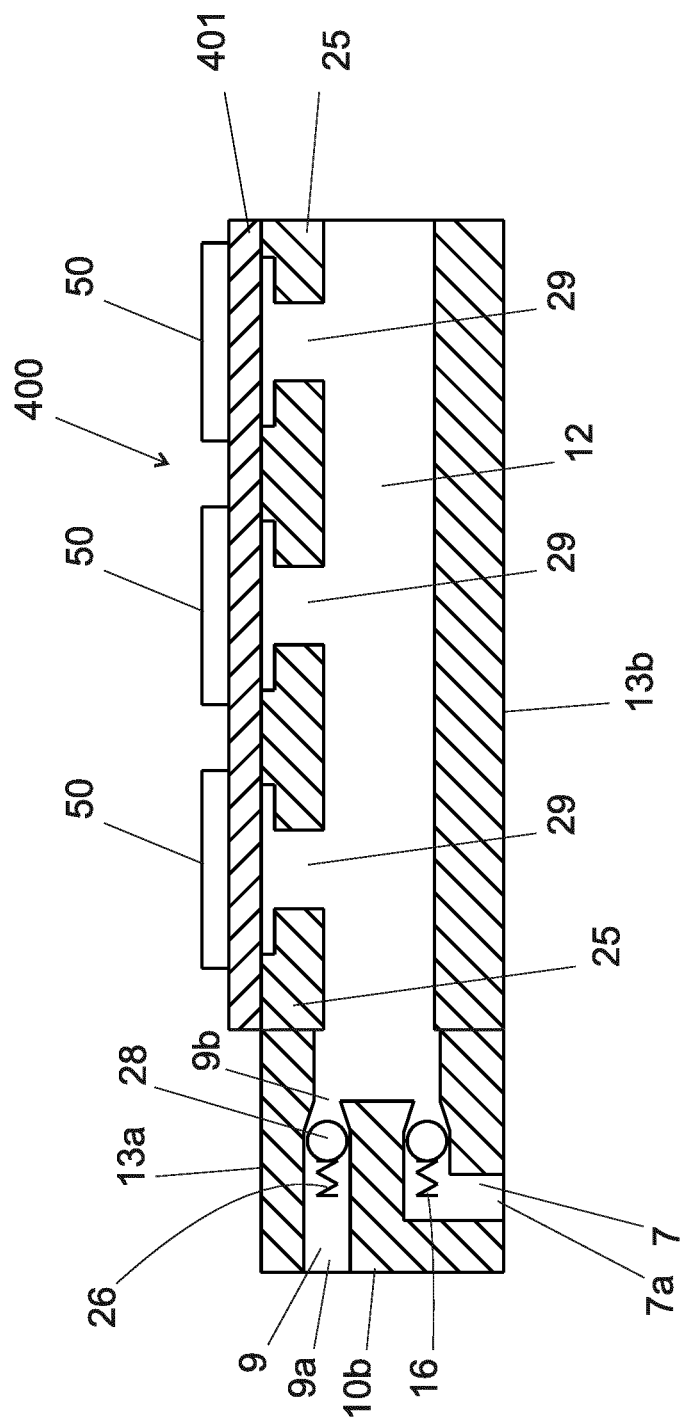
FIG. 6 illustrates a longitudinal section of a boat according to a further embodiment of the present invention.

FIG. 6 illustrates a longitudinal section of a boat 400 according to a further embodiment of the present invention. The boat 400 comprises many of the same features as the boat 1 shown in FIGS. 1-4 and like features are awarded the same reference numbers. However in the boat 400 the surface 3 is defined by a layer of porous material 401; the pores of the layer of porous material 401 define the holes 5 through which a vacuum can be passed to hold components on the surface 3. The conduits 29 in the support layer 25 fluidly connect the pores in the layer of porous material 401 with the single vacuum chamber 12. Preferably the layer of porous material 401 comprises aluminium alloys, copper alloys, ceramics and/or steel. It will be understood that the boat 400 may have any one or more of the features of the boat 1 described above; for example the boat 400 may further comprise tracks 55 as illustrated in FIG. 4 etc.

Figure 7:
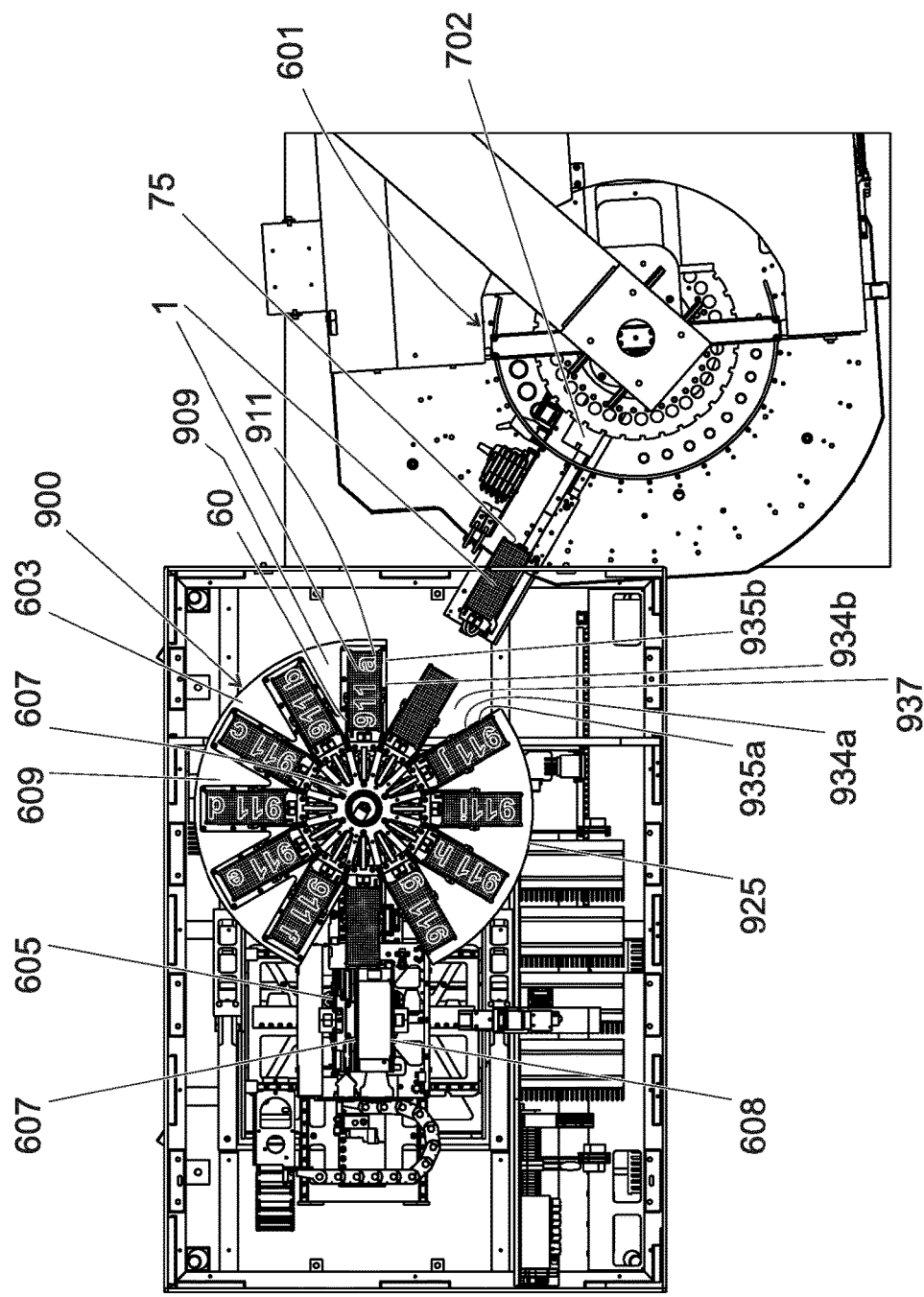
FIG. 7 provides a plan view of a component handling assembly according to an embodiment of the present invention.

FIG. 7 provides a plan view of a component handling assembly 600 which uses a boat 1,400 according to the present invention. For simplicity the embodiment will be described for when the component handling assembly 600 uses the boats 1 shown in FIGS. 1-5; but it will be understood that the component handling assembly 600 will have the same components and operate in the same manner when used with boats 400 of FIG. 6.

The component handling assembly 600 comprises:

A means 601 for loading/unloading a plurality of electronic components 50 onto/from the surface 3 of a boat 1 which is located in a loading/unloading area 702. In this example the means 601 for loading/unloading a plurality of electronic components 50 onto/from the surface 3 of a boat 1 comprises a rotatable turret 800 which comprises a plurality of component handling heads 801. However it will be understood that other suitable means may be used.

A temperature management system 900 which comprises a platform 909 having a plurality of temperature control stations 911 defined thereon, each of which can receive a boat 1 so that temperature of the boat 1 can be adjusted.

A testing station 605 at which the plurality of electronic components 50 which are located on the surface 3 of the boat 1 are tested. It will be understood that the testing station 605 will be configured according to the testing which is to be carried out on the electronic components 50. It will be understood that the present invention is not limited to any particular type of testing so the testing station may be have any suitable configuration to perform any test(s) on the electronic components 50.

A rotatable table 607 having a plurality of grippers 60 each of which can hold a boat 1. The rotatable table 607 being operated to rotate to move boats 1 between successive temperature control stations 911 on the platform 909 of the temperature management system 900, towards the testing station 605; and to move boats 1 away from the testing station 605 after the electronic components 50 on the boat 1 have been tested.

A carrier 75 for transporting boats 1 from the loading area 702, to a location where a gripper 60 on the rotatable table 607 can receive and hold the boat 1. In this example the carrier 75 is an x-y table 75, however it will be understood that other means may be used.

Figure 8:
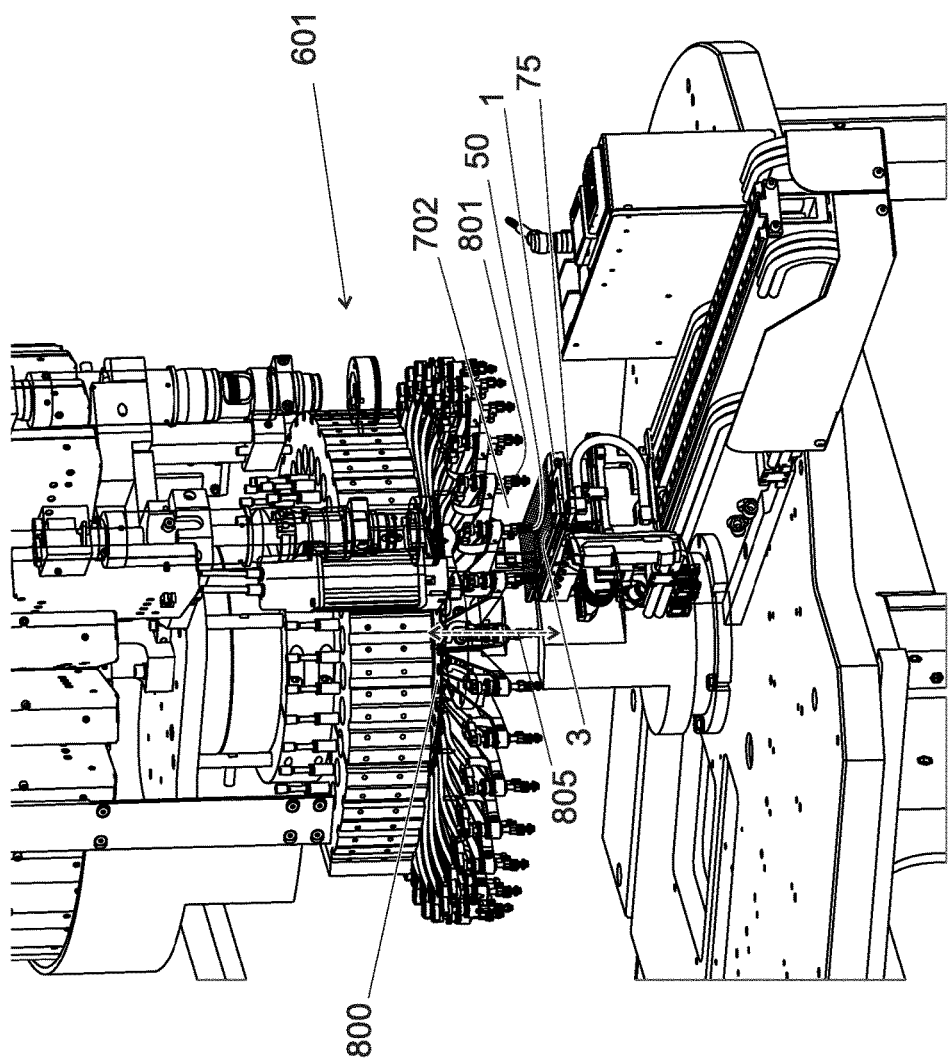
FIG. 8 provides a perspective view of a turret with its component handling used in the assembly of FIG. 7.

FIG. 8 provides a perspective view of the means 601 for loading a plurality of components onto the surface of the boat used in the component handling assembly 600 and also illustrates the means 615 for transporting boats 1. The carrier 75 for transporting boats 1 is also shown in FIG. 8, and the figure illustrates the boat 1 located on the carrier 75 and located in the loading area 702 where the means 601 for loading can load components 50 onto the surface 3 of the boat 1.

The means 601 for loading a plurality of components onto the surface of the boat comprises a rotatable turret 800 which comprises a plurality of component handling heads 801. Each of the component handling heads 801 is configured to hold a component 50 by means of a vacuum. Each of the component handling heads 801 is configured such that it can move linearly with respect to the rotatable turret 800 so that the component handling head 801 can be selectively advanced in a direction towards a boat 1 and/or away from a boat 1 which is located in the loading/unloading area 702. For example each of the component handling heads 801 is configured such that it can move linearly along a respective axis 805 which is perpendicular to a plane of the turret 800. The loading/unloading area 702 is an area below a component handling head 801 of the rotatable turret 800; the component handling head 801 can be selectively advanced in a direction towards a boat 1 which is located in the loading/unloading area 702, so that the component handling head 801 can place a component 50 on, or pick a component 50 from, the surface 3 of the boat 1. Once the component handling head 801 has placed a component 50 on, or picked a component 50 from, the surface 3 of the boat 1, the rotatable turret 800 can be rotated so that the next component handling head 801 is moved into loading/unloading area 702 where it can be selectively advanced in a direction towards a boat 1 which is located in the loading/unloading area 702, so that the component handling head 801 can place a component 50 on, or pick a component 50 from, the surface 3 of the boat 1.

Figure 9:
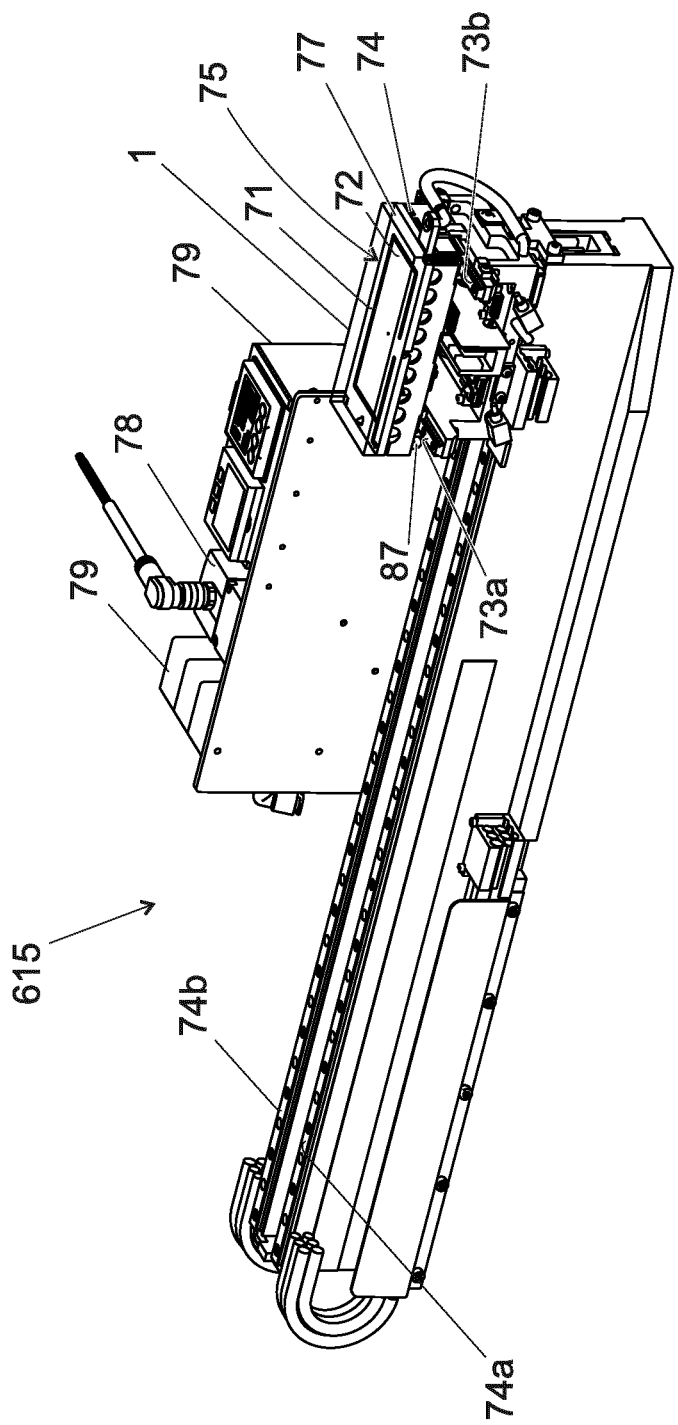
FIG. 9 provides a perspective view of an x-y table used in the assembly of FIG. 7.

FIG. 9 provides a perspective view of the x-y table 75. The x-y table 75 has the same features as the x-y table 75 shown in FIG. 5 and like features are awarded the same reference numbers.

The x-y table 75 comprises a platform 77 having a surface 72 on which on which a boat 1 (shown in transparent) is supported; the platform 77 can be moved in 2-dimensions via a first pair of rails 73a,b and a second pair of rails 74a,b which are arranged to extend perpendicular to one another. The x-y table 75 further comprises a conduit 76 which defines a conduit mouth 74 located at the surface 72 of the platform 77. The conduit 76 is fluidly connected to a first vacuum generating means in the form of a first vacuum generator 79. The first vacuum generator 79 may have any suitable configuration or design: For example the first vacuum generator 79 may comprise a venturi (such as a venturi generator); the venturi may be arranged to receive air from an air-supply; and a valve may be provided which is operable to adjust the pressure of the air which is input to the venturi; the level of vacuum generated by the venturi can be adjusted by adjusting the pressure of the air input to the venturi using the valve. In another embodiment the first vacuum generator 79 may comprises a pump such as a vacuum pump.

The first vacuum inlet 7 on the boat 1 is configured such that position of the input 7a of the first vacuum inlet 7 corresponds to the position of the conduit mouth 74 when the boat 1 is supported on the surface 72 of the platform 77; thus when the boat 1 is supported on the surface 72 of the platform 77 the first vacuum generator 79 will be fluidly connected with the first vacuum inlet 7, via the conduit 76, so that the first vacuum generator 79 can be selectively operated to provide a vacuum at the holes 5 on surface 3 of the boat 1.

The conduit 76 has a length sufficient so that it can connect an output of the first vacuum generator 79 with the conduit mouth 74 in the platform 77 over the whole range of x-y table; thus the first vacuum generator 79 can supply a vacuum to the holes 5 on the surface 5 of the boat 1 as the boat 1 is moved from the loading area 702 to the a location where a gripper 60 on the rotatable table 607 can grip the boat 1.

In this example the first vacuum generator 79 is provided as an independent component (i.e. independent of the turret and x-y table); however it should be understood that in a variation of the present invention the first vacuum generating means 79 may be integral to the x-y table 75, or integral to the rotatable turret 70, or integral to an assembly which comprises the rotatable turret 70.

A second opening 71 is defined in the platform 77; the second vacuum opening 71 is fluidly connected to a further vacuum generating means 78 via a conduit 87. The vacuum generating means 78 is configured to be selectively operable to generate a vacuum. When a boat 1 is supported on the platform 77 the boat 1 will overlay the second vacuum opening 71. Said further vacuum generating means 78 can then be operated to generate a vacuum which flows through the second vacuum opening 71 to be applied to the boat 1 to hold the boat 1 on the platform 77. Advantageously the vacuum applied to the boat 1 will hold the boat 1 on the platform as the x-y table 75 transports the boat 1.

Figure 10B:
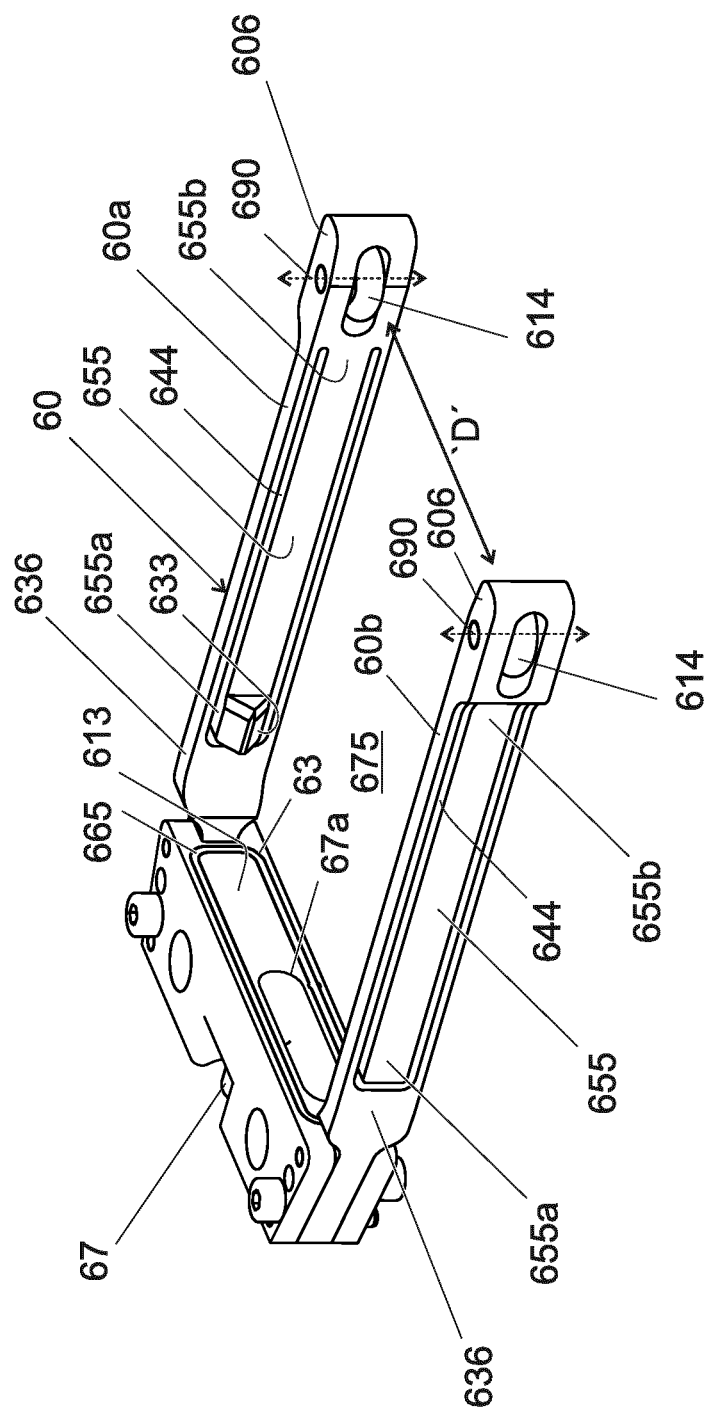

FIG. 10*a* provides a perspective view of the rotatable table 607 and FIG. 10*b* provides a perspective view of a gripper 60 of the rotatable table 607. The gripper 60 has many of the same features as the gripper shown in FIG. 4 and like features are awarded the same reference numbers.

The rotatable table 607 comprises a ring member 645 to which a plurality of grippers 60 are fixed. The ring member 645 can be rotated around an axis 616 by means of a torque motor 609. The rotatable table 607 further comprises a second vacuum generating means in the form of a second vacuum generator 610. The second vacuum generator 610 may have any suitable configuration or design: For example the second vacuum generator 610 may comprise a venturi (such as a venturi generator); the venturi may be arranged to receive air from an air-supply; and a valve may be provided which is operable to adjust the pressure of the air which is input to the venturi; the level of vacuum generated by the venturi can be adjusted by adjusting the pressure of the air input to the venturi using the valve. In another embodiment the second vacuum generator 610 may comprises a pump such as a vacuum pump. The second vacuum generator 610 is fluidly connected to each of the grippers 60 via a plurality of conduits 615. In this example a valve 611 is provided for each gripper 60 which is operable to control of the fluid communication between the second vacuum generator 610 and a respective conduit 615. Also in this example the second vacuum generator 610 is fluidly connected to each of the plurality of conduits 615 via a central rotary shaft 608 of the rotatable table 607; the vacuum is distributed from the central rotary shaft 608 to each of the grippers 60 via respective conduits 615. Typically, in use, the second vacuum generator 610 will be stationary and the central rotary shaft 608 will rotate, thus the rotatable table 607 may comprise a fluid connection body, which is provided on the central rotary shaft 608, and which is configured to provide a continuous fluid connection between the second vacuum generator 610 and central rotary shaft 608 as the central rotary shaft 608 rotates; this fluid connection body will allow the vacuum generated by the second vacuum generator 610 to be received into the rotating central rotary shaft 608.

As shown in FIG. 10*b* each gripper 60 comprises opposing arms 60*a,b*. The distance "D" between the opposing arms 60*a,b* is equal to or less than a width of the boat 1 so that the arms 60*a,b* can frictionally grip the boat 1. The opposing arms 60*a,b* comprise elastic material so that they can be forced apart when receiving a boat between the opposing arms 60*a,b* and can elastically return to frictionally grip the boat 1.

Importantly the gripper 60 further comprises a conduit 67 which is designed to fluidly connect with one of the conduits 615 of the rotatable table 607. The conduit 67 passes through the gripper to define a conduit mouth 67*a* located at an inner surface 613 of the gripper 60.

The conduit mouth 67*a* is configured such that it corresponds to the position of the input 9*a* of the second vacuum inlet 9 of the boat 1 when the boat 1 is held by the gripper 60; thus when the boat 1 is held by the gripper 60 the conduit 67 in the gripper will fluidly connect the second vacuum generator 610 with the second vacuum inlet 9 of the boat so that the second generator 610 can be selectively operated to provide a vacuum at the holes 5 on surface 3 of the boat 1.

A rubber seal 65 is further provided which extends from the inner surface 613 of the gripper 60. The rubber seal 65 is held in groove 665 which is defined in the inner surface 613.

Each opposing arm 60*a,b* comprises a free end 606 and a fixed end 636. The free end is configured to have a rounded profile. The opposing arms 60*a,b* of the gripper 60 each comprise wheel 614. In this example the wheels 614 are provided proximate to the free end 606 of each opposing arm 60*a,b*. The wheel 614 are arranged to have a rotational axis 690 which is perpendicular to the single plane on which both opposing arms 60*a,b* of the gripper lay. Each opposing arm 60*a,b* has a cut-out portion 644 which defines an inner member 655. The inner member has a fixed end 655*b* and free end 655*a*. At the free end 655*a* of each inner member 655 is provided a projection 633 (only the projection on one of the inner members 655 is visible in the figure). The projections 633 extend into the area 675, defined by the opposing arms 60*a,b*. The inner member 655 comprise elastic material so that they can be forced apart when receiving a boat between the opposing arms 60*a,b*.

Figure 11A:
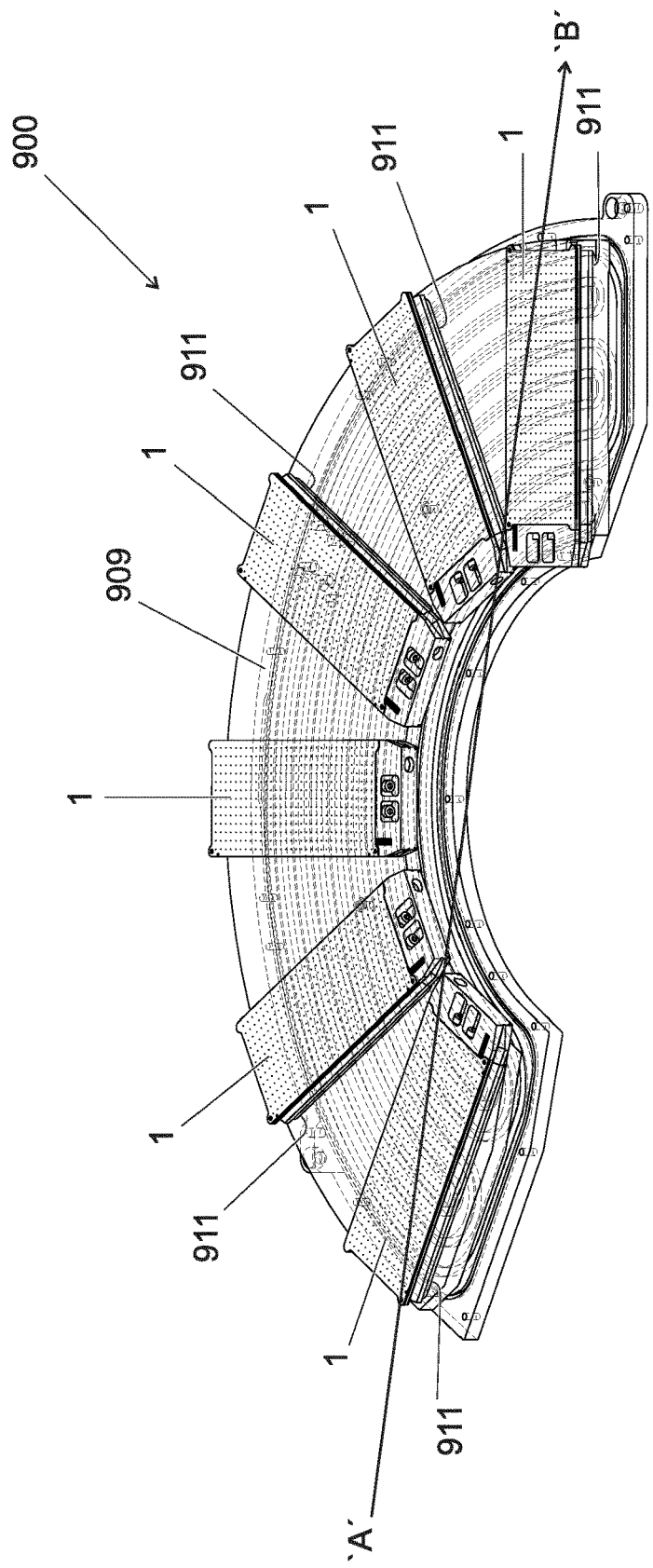
FIG. 11a provides a perspective view of a portion of the temperature management system used in the assembly of FIG. 7.

FIG. 11*a* provides a perspective view of a portion of the temperature management system 900 having a plurality of boats 1 located at respective temperature control stations 911. The temperature management system 900 is configured to have an annular profile and only part of the annular temperature management system 900 is illustrated in FIG. 11*a*. FIG. 11*b* provides a cross section of the temperature management system 900, taken along line 'A-B' shown in FIG. 11*a*.

Referring to FIGS. 11*a* and 11*b* the temperature management system 900 comprises a platform 909 having a plurality of temperature control stations 911 defined thereon each of which can receive a boat 1. In this example each of the temperature control stations 911 is defined by a raised platform 912 provided on a surface of an annular plate 913. The annular plate 913 and each of the raised platforms 912 are composed of thermally conductive material such as aluminium or copper alloys. Beneath each temperature control station 911 there is provided and a heating and/or cooling means 918,919; the heating means 918 is defined by an electrical silicon heater mat 918 which is attached (e.g. by glue) to the under-surface 915 of the annular plate 913. The cooling means 919 is comprises a plate member 921 having channels 920 defined therein which contain gaseous nitrogen. The plate member 921 is attached to the under-surface 915 of the annular plate 913 by raised strips 923 (each raised strip 923 may be glued to the under-surface 915 of the annular plate 913).

Each temperature control station 911 comprises a vacuum opening 914 (shown in FIG. 1e as oval-shaped vacuum opening 914) which is fluidly connected to a third vacuum generator 928 (FIG. 11e). The third vacuum generator may be selectively operated when a boat 1 is located at the temperature control station 911 so that a vacuum is applied to the boat 1 to suck the boat towards the thermally conductive platform 912. Advantageously this will reduce the air between the boat 1 and platform 912 thus enabling the temperature of the boat to be more efficiently adjusted by the heating and/or cooling means 918,919. Furthermore, advantageously this will hold the boat 1 in position on the platform 912.

As shown in FIG. 11b, the temperature management system 900 may comprise a housing 925 composed of thermally insulated material such as dimensionally stable insulating foam (i.e. insulating form whose dimensions do not change with temperature changes). The housing 925 defines a chamber 930 which houses the annular plate 913 and a heating and/or cooling means 918,919 and any components 50 which may be located on the temperature control stations 911.

Figure 11C:
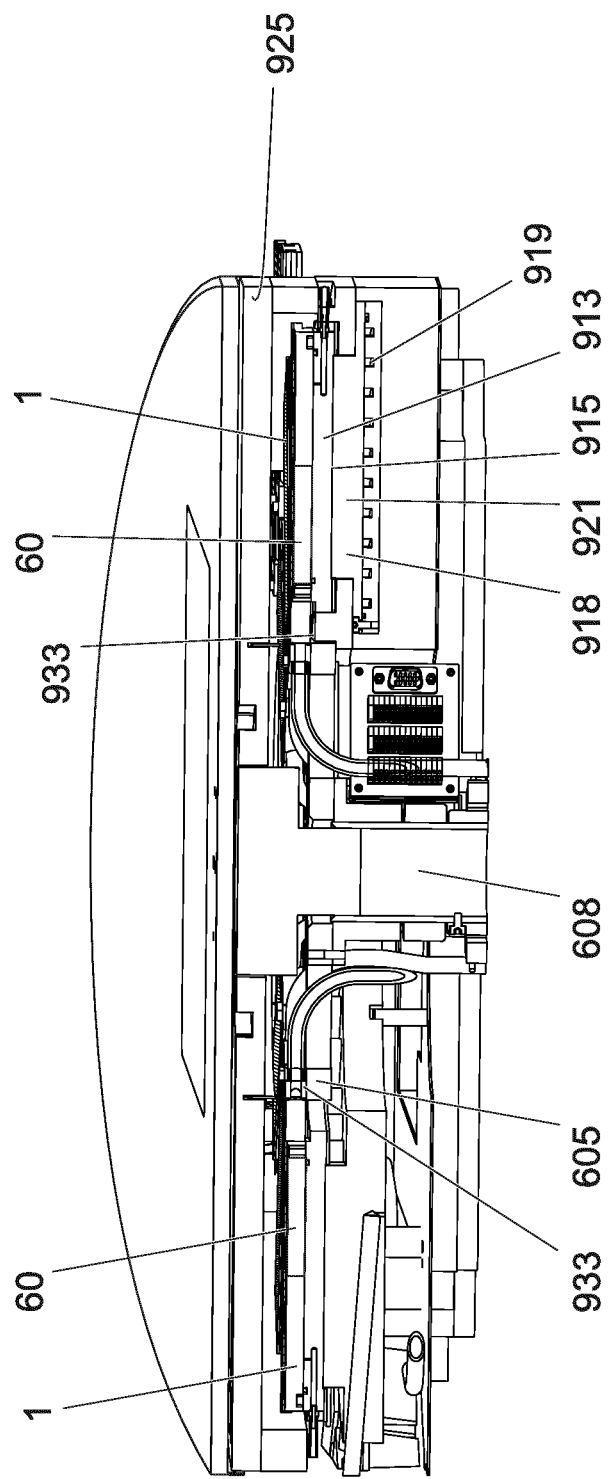
FIG. 11c provides a perspective cross section view of a portion of the housing used in the temperature management system.

FIG. 11c provides a perspective cross-section view of a portion of the housing 925 in of the temperature management system 900 which defines a chamber 930 which houses the annular plate 913 and a heating and/or cooling means 918,919 and any components 50. The housing 925 has an annular profile which matches the profile of the annular plate 913. The housing 925 further comprise an annular opening 933 which accommodates the ring member 645 (and/or conduits 615 and/or a part of the grippers 60 of the rotatable table 607).The annular opening 933 is large enough to permit the rotatable table 607 to rotate so that the grippers 60 can move boats 1 between the temperature control stations 911 on the annular plate 913. When the boats are moved between temperature control stations 911, all boats 1 located on respective thermally conductive platforms 912 are simultaneously lifted by respective gripper 60 on the rotatary table 607, and the rotatary table 607 is them indexed by 30° so that the boats 1 are above the next platform 912; the respective grippers 60 are the moved to drop the boats 1 on the platforms 912 below. In order to lift the grippers 60 simultaneously, the ring member 645 of the rotatory table 607 is lifted by 5 mm this causes the boats 1 to be lifted by the grippers 60 by 5 mm off the plate 912; the ring member 645 is the indexed by 30° and the moved down again by 5 mm so that each boats 1 is placed on the next respective platform 912. The lift off and rotate procedure is done to avoid any friction between plate 912 and the boats. It should be understood that the annular opening 933 is wide enough accommodate the ring member 645. Preferably the ring member 645 of the rotatory table 607 has dimensions which are substantially equal to the dimensions of the annular opening 933 so that the ring member 645 can substantially thermally seal the housing 925. However annular opening 933 is preferably wide enough permit the ring member 645 of the rotatory table 607 to be lifted, rotated and dropped, when moving the boats 1 to the next plate 912.

Referring back to FIG. 7 briefly, the housing 925 further comprises gate members 934a,b which are operable to seal openings 935a,b which are provided at opposing ends of the housing 925. The gate member 934a can be selectively opened to allow boats to be received into the housing 925 and the gate member 934b can be selectively opened to allow boats to be exited from within the housing 925. The gate members 934a,b can be selectively closed to substantially thermally seal the housing 925. It can be seen from FIG. 7 that the gripper 60 receives the boat 1 from the x-y table in the area 937 which is located outside of the housing 925, and between the gate members 934 of the housing 925; once the gripper 60 has received the boat 1, the gate member 934a opens and the ring member 645 of the rotatory table 607 is rotated to move the boat 1 held by the gripper 60 into the housing 925 via the opening 935a; simultaneously the opposite gate member 934b opens and a boat 1 having tested components exits the housing 925 via the opposite opening 935b.

FIG. 11d provides a perspective view of a portion of the plate member 921 with its raised strips 923 which are used to attach the plate member 921 to the under-surface 915 of the annular plate 913. The raised strips 923 are arranged in groups of three and are distributed symmetrically over an upper surface 935 of the plate member 921. The raised strips 923 each extend perpendicular to a tangent to the plate member 921.

FIG. 11e provides a perspective view of a portion of the annular plate 913 with temperature control stations 911 defined by a raised platforms 912. The shape and dimensions of the surface of each raised platforms 912 corresponds to the shape and dimensions of an under-surface 10a of a boat 1 so that the boat 1 can snugly fit onto each raised platform 912. The annular plate 913 is illustrated in FIG. 11e as being mounted on the plate member 921; specifically the raised strips 923 of the plate member 921 are attached to an under-surface 915 of the annular plate 913.

During use the boat 1 is supported on the surface 72 of the platform 77 of the x-y table 75 so that the input 7a of the first vacuum inlet 7 corresponds to the position of the conduit mouth 74 in the surface 72 of the platform 77; this ensure that the first vacuum generator 79 is fluidly connected with the first vacuum inlet 7 of the boat 1 so that the first vacuum generator 79 can be selectively operated to provide a vacuum at the hole 5 on the surface 3 of the boat 1.

The boat 1 may be moved onto the surface 72 of the platform 77 by a suitable boat handler. Preferably the boat 1 is moved to occupy a predefined position on the surface 72. Once the boat 1 is moved onto the surface 72 the boat 1 will overlay the second vacuum opening 71. The further vacuum generating means 78 is operated to generate the vacuum so that a vacuum force is applied to the boat 1 via the second vacuum opening 71; preferably the vacuum force holds the boat 1 in a predefined position on surface 72 of the platform 77

The x-y table 75 is then operated to move the boat 1 into a loading area where a component handling heads 801 on the rotatable turret 800 can load components 50 onto the surface 3 of the boat 1.

Once the boat 1 has been supported on the platform 77 and the x-y table has moved the boat into the loading area, the first vacuum generator 79 is then operated to provide a vacuum (it should be understood that alternatively the first vacuum generator 79 may be operated to provide a vacuum once the boat 1 has been supported on the platform 77 and prior to the x-y table moving the boat into the loading area). The vacuum generated by the first vacuum generator 79 sucks the first plug member 18 against the biasing force of the first spring 16 to unplug the output 7*b* of the first vacuum inlet 7; the vacuum generated by the first vacuum generator 79 will thus pass into the single vacuum chamber 12 and from there to the holes 5 on the surface 3 of the boat 1.

A component handling head 801 on the turret 800 is then operated to advance towards the boat 1 and place a component which is holds onto the surface 3 of the boat 1. The vacuum generated at the holes 5 by the first vacuum generator 79 will hold the placed component on the surface 3 of the boat 1.

The turret 800 will rotate so that the next component handling head 801 which holds a component 50 is moved into a position where it can load the component 50 which it holds onto the surface 3 of the boat 1. The x-y table will then be moved so that the next vacant position on the surface 3 of the boat 1 is presented to receive the component 50 from said next component handling head 801. The component handling head 801 on the turret 800 is then operated to advance towards the boat 1 and place the component 50 which is holds onto the surface 3 of the boat 1. These steps are repeated until a predefined number of components 50 have been placed onto the surface 3 of the boat 1. It should be noted that as boat 1 is being loaded with components 50 (i.e. as the predefined number of components 50 are being placed onto the surface 3 of the boat 1 by the component handling heads 801 on the turret 800) the vacuum at the holes 5 is provided by the first vacuum generator 79 exclusively.

After the predefined number of components 50 have been placed onto the surface 3 of the boat 1 the x-y table transports the boat 1 from the loading area to the rotatable table 607. This is achieved by moving the platform 77 along the rails 73*a,b*, 74*a,b* of the x-y table 75. As the x-y table 75 transports the boat 1 to the rotatable table 607 the first vacuum generator 79 is operated so that it, exclusively, provides a vacuum at the holes 5 as the boat 1 is being transported. Advantageously the vacuum holds the components 50 in the position which they were originally placed on the boat 1 as the boat 1 is being transported so that the components 50 do not become displaced during transport. Since the conduit 76 which fluidly connects the first vacuum generator 79 with the conduit mouth 74 at the surface 72 of the platform 77, has a length sufficient so that it can fluidly connect the first vacuum generator 79 with the vacuum hole 74 in the platform 77 over the whole range (i.e. range of movement) of x-y table 75, this enables the first vacuum generator 79 to provide a vacuum at the holes 5 as the x-y table 75 transports the boat 1 to the rotatable table 607.

The rotatable table 607 is arranged at a height which ensures that its grippers 60 lie on substantially the same plane as plane which the boat 1 occupies when it is supported on the surface 3 of the boat 1. The rotatable table 607 is also arranged so that an empty gripper 60*a* on the rotatable table 607 is positioned so that the x-y table can move the boat 1 into the gripper 60*a* by moving along its rails 74*a,b*. As the platform 77 approaches the end of the rails 74*a,b*, the wheels 614 on the gripper 60 are received into respective mouth portions 59 provided at opposite sides 57*a,57b* of the boat 1.

As the platform 77 continues to move towards the end of the rails 74*a,b*, the wheels 614 move along the tapered channel 53 of the mouth portion 59 and subsequently along respective tracks 55 at opposite sides 57*a,57b* of the boat 1.

As the platform 77 continues to move towards the end of the rails 74*a,b*, the projections 63 on the gripper are received into respective mouth portions 59 and may be subsequently moved along a portion of the respective tracks 55.

The boat 1 is eventually moved by the platform 77 to abut the rubber seal 65 of the gripper at which point the position of the input 9*a* of the second vacuum inlet 9 on the boat 1 will correspond to the position of the conduit mouth 67*a* of the gripper. In this position the input 9*a* of the second vacuum inlet 9 on the boat 1 will be fluidly connected to the conduit mouth 67*a* of the gripper 60; thus the second vacuum generator 89 can be selectively operated to provide a vacuum at the hole 5 on the surface 3 of the boat. Preferably, the input 9*a* of the second vacuum inlet 9 on the boat 1 will be located directly opposite to the conduit mouth 67*a* of the gripper 60 when the boat 1 is in a position where it abuts the rubber seal 65.

Since the distance between the opposite arms 60*a,b* of the gripper 60 is equal to or less than the width of the boat 1, the arms 60*a,b* of the gripper 60 can hold the boat 1 by friction. The wheels 614 and projections 63 maintain the boat 1 in the desired plane as it is held by the gripper 60. At this point (i.e. as the boat 1 is held by the gripper 60) the first vacuum generator 79 is still fluidly connected with the first vacuum inlet 7 of the boat 1; and the first vacuum generator 79 continues to be operated to provide a vacuum at the hole 5 on the surface 3 of the boat 1.

Next the second vacuum generator 89 is operated to generate a vacuum. The vacuum generated by the second vacuum generator 89 flows through the conduit 67 and into the second vacuum inlet 9 in the boat 1. The vacuum generated by the second vacuum generator 89 sucks the second plug member 28 against the biasing force of the second spring 26 to unplug the output 9*b* of the second vacuum inlet 9. The vacuum generated by the second vacuum generator 89 will thus pass into the single vacuum chamber 12 and from there to the holes 5 on the surface 3 of the boat 1. Accordingly a vacuum at the holes 5 on the surface 3 of the boat 1 will be provided by both the first and second vacuum generator 79,89 simultaneously.

It is noted that the vacuum generated by the second vacuum generator 89 also happens to facilitate the gripper 60 to hold the boat 1. Although the gripper 60 holds the boat 1 by friction, additionally the second vacuum generator 89 will create a vacuum within the volume defined by rubber seal 65 which will suck the boat 1 towards the rubber seal 65 thereby helping to maintain the boat between the opposite arms 60*a,b* of the gripper 60.

With the boat 1 held by the gripper 60 on the rotatable table 607 a step of stopping the fluid communication between the first vacuum generator 79 and holes 5 on the surface 3 of the boat 1 is then carried out. This can be achieved for example by, moving rotating the rotatable table 607 and/or by simply turning off the first vacuum generator 79 so that it does not generate a vacuum. In this example the first vacuum generator 79 be turned off so that the first vacuum generator 79 is no longer supplying a vacuum to first vacuum inlet 7 thus stopping the fluid communication between the first vacuum generator 79 and holes 5. When the first vacuum generator 79 is no longer supplying a vacuum to first vacuum inlet 7 the first plug member 18 is moved, under the biasing force of the first spring 16, to plug the output 7*b* of first vacuum inlet 7. It should be noted that the second vacuum generator 89 will continue to be operated; accordingly at this stage the vacuum at the holes 5 on the surface 3 of the boat 1 is provided exclusively by the second vacuum generator 89 which continues to operate.

After the first vacuum generator 79 be turned off the rotatable table 607 is lifted to lift the boat 1 from the platform 77; once the boat 1 is lifted the rotatable table 607 is then rotated. The lifting (and/or rotation) of the rotatable table 607 causes the first vacuum inlet 7 on the boat 1 to become removed from conduit mouth 74 such the position of the input 9*a* no longer corresponds to the position of the conduit mouth 74.

In a variation of the present invention the rotatable table 607 is rotated prior to turning off the first vacuum generator 79: In this variation, rotating the rotatable table 607 forces the first vacuum inlet 7 on the boat 1 to become removed from conduit mouth 74 such the position of the input 9*a* no longer corresponds to the position of the conduit mouth 74 thereby ensuring that the first vacuum inlet 7 is no longer in fluid communication with the conduit 76 (for example the first vacuum inlet 7 on the boat 1 will be disjoined from the conduit mouth 74). Once the boat 1 has been moved so that the first vacuum inlet 7 is no longer in fluid communication with the conduit 76 the first vacuum generator 79 is then turned off. When the first vacuum generator 79 is no longer supplying a vacuum to first vacuum inlet 7 the first plug member 18 is moved, under the biasing force of the first spring 16, to plug the output 7*b* of first vacuum inlet 7. It should be noted that the second vacuum generator 89 will continue to be operated; accordingly at this stage the vacuum at the holes 5 on the surface 3 of the boat 1 is provided exclusively by the second vacuum generator 89.

The rotatable table 607 is then rotated to transport the boat 1 in the gripper 60 a temperature control station 911 on the platform 909 of thermal management system 900. The boat 1 is placed onto the temperature control station 911 by the gripper 60.

Once the boat 1 is placed onto the temperature control station 911 by the gripper 60 the third vacuum generator is operated to generate a vacuum at the vacuum opening 914 so that a vacuum is applied to the boat 1 to suck the boat towards the thermally conductive platform 912.

The heating and/or cooling means are operated to bring the boat (and the components 50 which are on its surface 3) to a predefined temperature. In this example in order to increase the temperature of the boat 1 (and the components 50 which are on its surface 3) the electrical silicon heater mat 918 is brought to a predefined temperature which is above the temperature of the gaseous nitrogen, so that the boat 1 (and the components 50 which are on its surface 3) is heated to a predefined temperature. Advantageously the vacuum applied to the boat 1 which sucks the boat 1 towards the thermally conductive platform 912 reduces the air interface between the boat and the thermally conductive platform 912 which enables the boat 1 to be heated to its predefined temperature quicker.

Once the boat has been heated to the predefined temperature the rotatable table 607 is then rotated to transport the boat 1 to the next pocket where the process is repeated to bring the boat to another, different predefined temperature. In the example illustrated in FIG. 7 the predefined temperature to which the boat 1 is heated gradually increases between temperature control stations 911 until the boat 1 reaches the testing station 605 so that the boat 1 is effectively gradually heated as it is moved along the series of temperature control stations 911 preceding the testing station 605. For example, the boat 1 is typically at an ambient temperature of 23° C. when it first enters the temperature management system 900; referring to FIG. 7 at the first temperature control station 911*a* the boat is heated to a predefined temperature of 55° C.; in a second temperature control station 911*b* the boat is heated to a predefined temperature of 73° C.; in a third temperature control station 911*c* the boat is heated to a predefined temperature of 80° C.; in a fourth temperature control station 911*d* the boat is heated to a predefined temperature of 84° C.; in a fifth temperature control station 911*e* the boat is heated to a predefined temperature of 88° C.; in a sixth temperature control station 911*f* the boat is heated to a predefined temperature of 90° C. The predefined temperature of 90° C. to which the boat is heated to in the sixth temperature control station 911*f* will heat the components 50 to a predefined desired temperature (e.g. 88° C.) which the components should have when they are being tested at the testing station 605. Preferably the heating and/or cooling means has the same temperature at each temperature control station 911*a-f*; in this example the heating means at each temperature control station 911*a-f* has a temperature of preferably 100° C. for example. In other embodiments the heating and/or cooling means may have different temperatures at each of the temperature control station 911*a-f*. Preferably a predefined time duration is designated for heating (or cooling) of the boats; for example a predefined time duration may be designated for heating the boats to the predefined temperature (90° C. in this example) required for testing at the testing station 607. This predefined time during is then divided by the number of temperature control stations 911*a-f* available to heat the boat 1 before it reaches the test station 607, to determine the duration of time that a boat 1 should remain at each temperature control station 911*a-f*. In the above-mentioned example six temperature control stations 911*a-f* are available to heat the boat 1 before it reaches the test station 607 and the predefined time duration designated for heating the boat 1 to its predefined temperature (90° C. in this example) required for testing is 120 seconds; accordingly the boat 1 can remain for 20 seconds at each temperature control station 911*a-f* (i.e. 120 seconds/6). This means that the boat 1 must be heated to a temperature of 55° C. within 20 seconds at the first temperature control station 911*a*; be heated to a temperature of 73° C. within 20 seconds at the second temperature control station 911*b* etc. so that the boat 1 is heated to the predefined temperature of 90° C. at the sixth temperature control station 9911*f* by the end of 120 seconds. In another example the boat is progressively heated to a predefined temperature of 155° C. by passing it through the temperature control stations 911*a-f*.

After the boat 1 has been picked from the sixth temperature control station 911*f* it is then moved by the rotatable table 607 to the testing station 605 where the components 50 on the surface 3 of the boat 1 are tested. Since at the sixth temperature control station 911*f* the boat will have been heated to a predefined temperature of 900, each of the components 50 on the surface 3 of the boat 1 will have for example the predefined desired temperature of 88° C. (taking account of heat loss between the boat and components; due to the low thermal mass of the component, heat losses are minimal) when undergoing testing at the testing station 605.

As mentioned the testing station 605 what take any suitable configuration to perform any test(s) on the electronic components 50 which are located on the surface 3 of a boat 1. In this particular example the testing station 605 comprises a plunger 670 (FIG. 7). The plunger 670 comprise a carriage 608 which can hold a boat 1; the plunger is typically designed to move the carriage in circular path and the carriage can extend linearly. In the present example in order to receive the heated boat 1 into the testing station for testing of the components 50 on the surface 3 of the boat, the carriage 608 moved so that it is aligned under the boat 1 which is held by the gripper 60. The gripper 60 then releases the boat onto the carriage 608. The boat 1 is held on the carriage using a suitable holding means (e.g. a vacuum or mechanical holding means). The plunger then operates to move the carriage along the circular path so that the boat 1 is moved to above a testing position; the carriage is then extended linearly so that the boat 1 is moved into the testing position. At the testing position the component 50 on the surface 3 of the boat 1 are tested. After testing the boat 1 is picked from the testing station by the carriage; and the plunger is operated to continue to move the carriage along the circular path so that the boat 1 is moved to above a testing position again. The carriage 608 is then moved towards the gripper 60 so that the arms of the gripper grip the boat 1 once again.

Once the boat 1 has been received into the gripper 60, the rotatable table 607 is rotated to transport the boat 1 to four more temperature control station 911g-j where the boat 1 (and the components 50 which are on its surface 3) is gradually cooled using the same principles as described above. Preferably in order to cool the boat 1 (and the components 50 which are on its surface 3) the electrical silicon heater mat 918 is brought to a predefined temperature which is below the temperature of the gaseous nitrogen. In a preferred embodiment the boat is cooled to a temperature which is above ambient temperature. For example the component handling heads may comprise silicon which can only withstand a temperature of 80° C.; the components may have been heated to a temperature of 155° C. for testing; the boat may be cooled to a temperature of 70° C. so that the components 50 are still at temperature of 68° C. for example (taking account of heat loss between the boat and components) after the boat 1 has been passed through the four more temperature control stations 911g-j. The temperature of the boat 1 may be further maintained by means of a temperature control means provided in the carrier 75, as discussed above.

Once the boat 1 (and the components 50 which are on its surface 3) has been cooled to a predefined temperature (i.e in this example once the boat has been passed though the four more temperature control station 911g-j) the boat is moved back onto the x-y table 75. The x-y table 75 transports the boat 1 back to the loading/unloading area 702 wherein component handling heads 801 on the rotatable turret 800 pick the tested components 50 from the boat 1.

Figure 12:
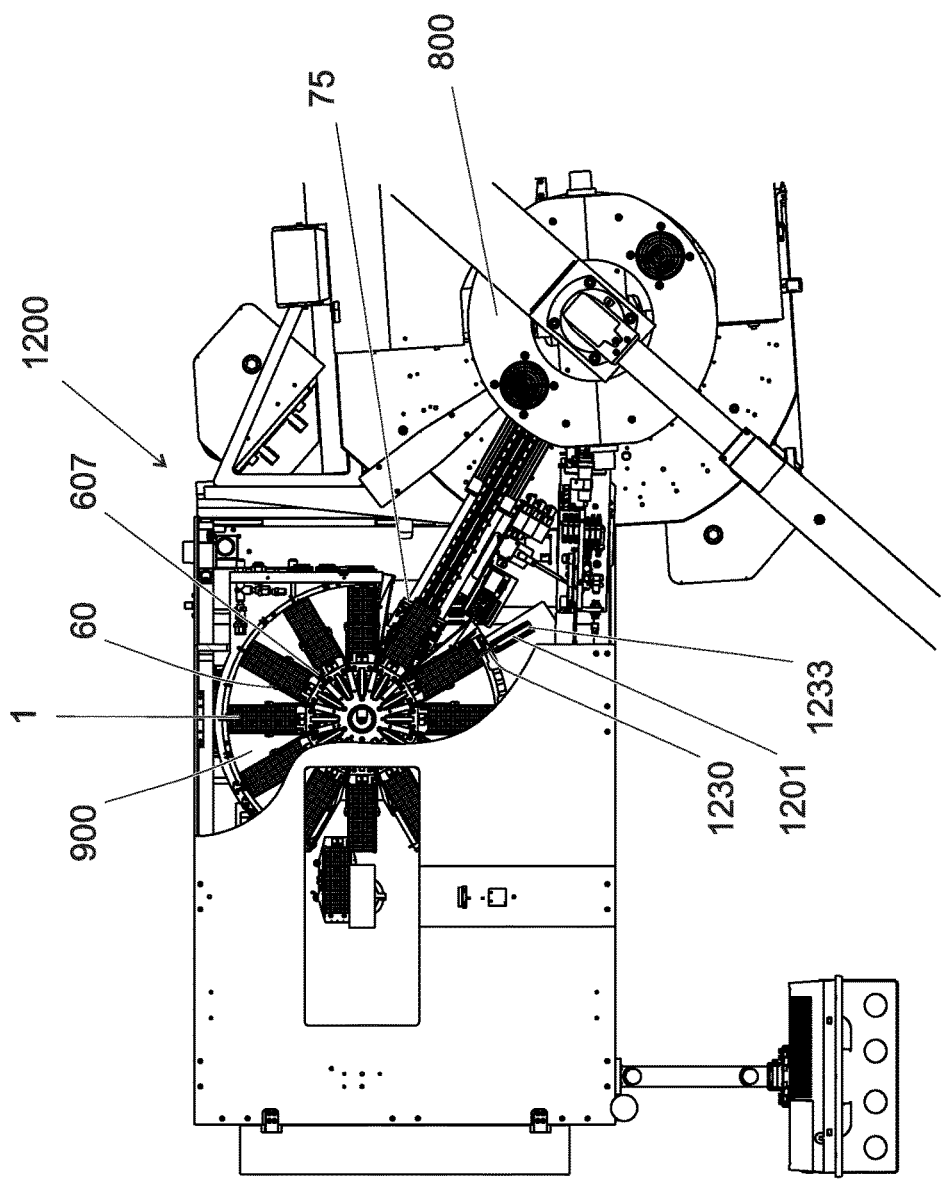
FIG. 12 provides an aerial view of a component handling assembly according to a further embodiment of the present invention.

Optionally the component handling assembly 600 may further comprise a cleaning station at which empty boats (i.e. boats in which all components 50 have been picked from) can be cleaned. FIG. 12 shows an aerial view of a component handling assembly 1200 according to a further embodiment of the present invention. The component handling assembly 1200 has many of the same features as the component handling assembly 600 shown in FIG. 7 and like features are awarded the same reference numbers. It will be understood that the component handling assembly 1200 may include any of the features of the components handling assembly described above. The component handling assembly 1200 further includes a cleaning station 1201.

Figure 13:
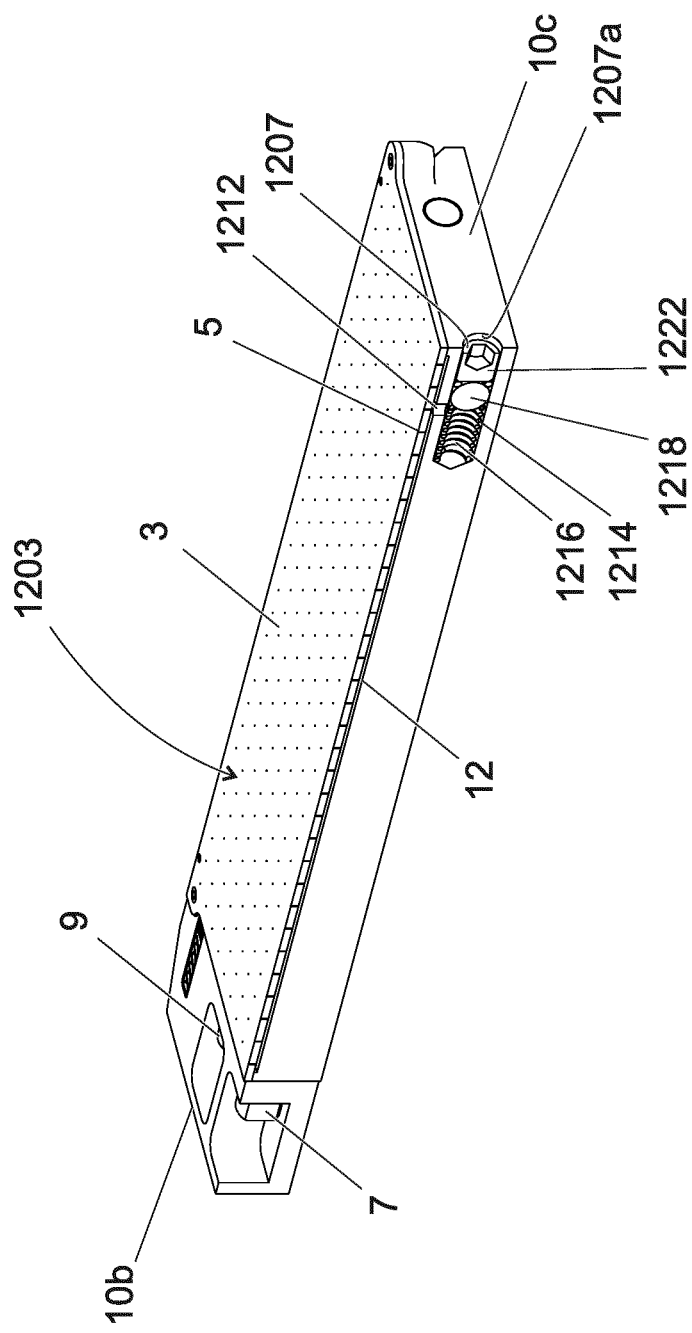
FIG. 13 provides a perspective view of a boat according to a further embodiment of the present invention.

FIG. 13 provides a perspective view of a boat 1203 according to a further embodiment of the present invention. A plurality of boats 1203 are preferably used in the component handling assembly 1200 shown in FIG. 12. The boats 1203 used in the component handling assembly 1200 have many of the same features as the boats shown in FIGS. 1 and/or 6 and like features are awarded the same reference number. It will be understood that the boats 1203 may include any of the features of the boats 1,400 described above. As can be seen in FIG. 13 the boat 1203 further comprise a third inlet 1207. The third inlet 1207 comprises an input 1207a which is located at a back surface 10c which is at an opposite end of the boat 1203 to the end at which has the front-surface 10b.

The third inlet 1207 is in fluid communication with said single vacuum chamber 12 via a conduit 1212.

The third inlet 1207 further comprises a third check valve 1214, which is operable to control the flow of fluid (such as the flow of pressurized air for example) between the input 1207a and the conduit 1212 and thus the single vacuum chamber 12. The third check valve 1214 comprises a third biasing means in the form of a third spring 1216 which biases a third plug member 1218 towards plugging the input 1207a of the third inlet 1207. The third plug member 1218 is configured such that it will prevent fluid communication between the input 1207a and the single vacuum chamber 12 when it plugs the input 1207a of the third inlet 1207. The third plug member 1218 is movable, by providing pressurized air flow into the input 1207a of the third inlet 1207; the pressurized air pushes the third plug member 1218 against the biasing force of the third spring 1216 until the third plug member 1218 is pushed beyond the conduit 1212; once the third plug member 1218 is pushed beyond the conduit 1212 the pressurized air will flow through the conduit 1212 and into the single vacuum chamber 12 and out of the single vacuum chamber 12 via the holes 5 in the surface 3 of the boat 1203.

The third inlet 1207 further comprises a socket element 1222 which is configured to mechanically cooperate with a pressurized air source; for example socket element 1222 may be configured to mechanically cooperate with an output nozzle of a pressurized air source. An o-ring 1223 is provided between the socket element 1222 and the third plug member 1218 to minimise fluid leakage (it will be understood that the first and second inlets 7,9 in the boat may further comprise o-rings). Optionally, the socket element 1222 may be replaceable i.e. is configured to be removably attached to the boat in third inlet 1207. Providing a socket element 1222 which is replaceable allows other types of socket elements, which can cooperate with other different types of nozzles, to be provided in the third inlet 1207, so that the boat 1203 can be adapted to receive pressurized air from different pressurized air sources having different types of nozzles.

Reverting to FIG. 12 the cleaning station 1201 of the component handling assembly 1200 comprises a pressurized air source 1233 which has an output nozzle 1230. The output nozzle 1230 is configured such that it can mechanically cooperate with the socket element 1222 in a boat 1203. The pressurized air source 1233 is configured such that it can output, via the output nozzle 1230, a pressurized air flow which has pressure which is sufficient to overcome the biasing force applied by the third spring 1216 to the third plug member 1218 in the third inlet 1207 of the boat 1203.

During use, after all the components have been tested and picked from their respective boats 1203; the empty boats 1203 as transported consecutively via the x-y table 75, to the rotatable table 607 where each boat 1203 is held by a respective gripper 60. The rotatable table 607 rotates to move each boat 1203 towards the cleaning station. (Unlike as before when the boats supported components 50 to be tested, the temperature management system 900 is not operated and the testing station 605 is bypassed since there are no components on the boats 1203 to be tested). Once a boat 1203 has been rotated to be adjacent the cleaning station 1201 the output nozzle 1230 of the pressurized air source 1233 is moved so that it mechanically cooperates with the socket element 1222 of the third inlet 1207 so as to fluidly connect the pressurized air source 1233 with the third inlet 1207. In this example the boat 1203 remains stationary and the output nozzle 1230 of the pressurized air source 1233 is moved fluidly connect with the boat 1203; however in another embodiment the output nozzle 1230 may be stationary and the boat 1203 may be moved to fluidly connect with the output nozzle 1230.

Once the pressurized air source 1233 has been fluidly connected to the third inlet 1207 the pressurized air source 1233 is operated to generate pressurized air which flow into the third inlet 1207. The pressurized air pushes the third plug member 1218 against the biasing force of the third spring 1216 until the third plug member 1218 is pushed beyond the conduit 1212; once the third plug member 1218 is pushed beyond the conduit 1212 the pressurized air will flow through the conduit 1212 and into the single vacuum chamber 12 and out of the single vacuum chamber 12 via the holes 5 in the surface 3 of the boat 1203. Advantageously as the pressurized air will flows through the holes 5 in the surface 3 of the boat 1203 it will clean the holes 5 of any debris, such as dust particles, which would otherwise compromise fluid flow (e.g. vacuum) through the holes 5.

The above-mentioned example describes rotating the empty boats 1203 towards the cleaning station 1201 using the rotatable table 607 i.e. using the same rotation table 607 which is used to transport the loaded boats towards the testing station 605; however it will be understood that another, second rotatable table may be provided in the assembly which rotates the empty boats 1203 towards the cleaning station 1201 so as to allow testing of components 50 on boats and cleaning of boats to be carried out in parallel.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A boat which comprises,
   a surface on which a plurality of electronic components can be supported, the surface having a plurality holes defined therein through which a vacuum can be passed to hold components on the surface; and
   a first vacuum inlet which is in fluid communication with the plurality of holes, wherein the first vacuum inlet can be fluidly connected to a first vacuum generating means so that the first vacuum generating means can provide a vacuum at the plurality of holes;
   a second vacuum inlet which is in fluid communication with the same plurality of holes with which the first vacuum inlet is in fluid communication with, wherein the second vacuum inlet can be fluidly connected to a second vacuum generating means so that the second vacuum generating means can provide a vacuum at the plurality of holes,
   wherein the boat comprises a single vacuum chamber which is in fluid communication with the holes defined in said surface; and wherein the first vacuum inlet and the second vacuum inlet are each in fluid communication with said single vacuum chamber; and wherein the boat further comprises a first check valve which is arranged between an input and an output of first vacuum inlet, and a second check valve which is arranged between an input and output of the second vacuum inlet.

2. A boat according to claim 1 wherein the boat further comprises,
   a single vacuum chamber which is provided below the surface of the boat;
   wherein each of the plurality holes is in fluid communication with the single vacuum chamber; and
   wherein the first vacuum inlet and the second vacuum inlet are each in fluid communication with said single vacuum chamber.

3. A boat according to claim 1, wherein the first vacuum inlet is configured such that it can be selectively fluidly connected to the first vacuum generating means so that the first vacuum generating means can provide a vacuum at the plurality of holes; and
   wherein the second vacuum inlet is configured such that it can be selectively fluidly connected with an output the second vacuum generating means such that the second vacuum generating means can provide a vacuum said plurality of holes.

4. A method of handling electrical components, using a boat which comprises, a surface on which a plurality of electronic components can be supported, the surface having a plurality holes defined therein through which a vacuum can be passed to hold components on the surface: and a first vacuum inlet which is in fluid communication with the plurality of holes, wherein the first vacuum inlet can be fluidly connected to a first vacuum generating means so that the first vacuum generating means can provide a vacuum at the plurality of holes: a second vacuum inlet which is in fluid communication with the same plurality of holes with which the first vacuum inlet is in fluid communication with, wherein the second vacuum inlet can be fluidly connected to a second vacuum generating means so that the second vacuum generating means can provide a vacuum at the plurality of holes, the method comprising the steps of,
   fluidly connecting the first vacuum inlet on the boat with the first vacuum generating means so that the first vacuum generating means is in fluid communication with the plurality of holes;
   generating a vacuum at the plurality of holes using exclusively the first vacuum generating means;
   placing a plurality of components on the surface of the boat as the first vacuum generating means exclusively generates a vacuum at the plurality of holes;
   fluidly connecting second vacuum generating means to the second vacuum inlet, while the first vacuum inlet is fluidly connected to the first vacuum generating means, so that the second vacuum generating means and first vacuum generating means simultaneously provides a vacuum at the plurality of holes;
   stopping the fluid communication between the first vacuum inlet on the boat and the first vacuum generating means so that a vacuum at the plurality of holes is generated by the second vacuum generating means exclusively.

5. A method according to claim 4 further comprising the steps of,
   transporting the boat from a location where the components are placed on the surface of the boat, to another location, and
   generating a vacuum at the plurality of holes using the first vacuum generating means exclusively, as the boat is being transported.

6. A method according to claim 4, wherein the method comprises the steps of,
receiving the boat into a loading area;
fluidly connecting the first vacuum inlet on the boat with the first vacuum generating means; and
wherein the step placing a plurality of components on the surface of the boat as the first vacuum generating means exclusively generates a vacuum at the plurality of holes comprises, placing each of the plurality of components consecutively on the surface of the boat using a component handling heads provided on a rotatable turret.

7. A method according to claim 4, wherein the step of fluidly connecting second vacuum generating means to the second vacuum inlet comprises,
receiving the boat into a gripper which has a conduit which is fluidly connected to the second vacuum generating means and wherein the conduit is positioned in the gripper such that when the boat is received into the gripper the conduit will be fluidly connected to the second vacuum inlet of the boat.

8. A method according to claim 7 wherein the gripper is provided on a rotary table, and wherein the method further comprises the steps of,
transporting the boat between a plurality of temperature control stations, by rotating the rotary table; and
adjusting the temperature of the boat using heating means and/or cooling means, when the boat is located in each of the temperature control stations.

9. A method according to claim 8 wherein the method further comprises the step of,
applying a vacuum to the boat when it is positioned in a temperature control station so as to reduce the air interface between the boat and temperature control station thereby increasing thermal conduction between the boat and heating means and/or cooling means.

10. A component handling assembly comprising,
one or more boats according to claim 1.

11. A component handling assembly according to claim 10 wherein the assembly further comprises,
the first vacuum generating means which can be fluidly connected to the first vacuum inlet on the boat so that the first vacuum generating means is in fluid communication with the plurality of holes;
a means for placing a plurality of components on the surface of the boat as the first vacuum generating means exclusively generates a vacuum at the plurality of holes;
second vacuum generating means which can be fluidly connecting to the second vacuum inlet, while the first vacuum inlet is fluidly connected to the first vacuum generating means, so that the second vacuum generating means and first vacuum generating means can simultaneously provide a vacuum at the plurality of holes.

12. A component handling assembly according to claim 10 wherein the assembly further comprises,
a means for transporting the boat from a location where the components are placed on the surface of the boat, to another location, and
wherein the first vacuum generating means is configured so that it can generate a vacuum at the plurality of holes using the first vacuum generating means exclusively, as the boat is being transported.

13. A component handling assembly according to claim 10, wherein the assembly further comprises,
a rotatable table having a plurality of grippers each of which can hold a boat; and
wherein each gripper has a conduit defined therein which is fluidly connected to the second vacuum generating means and is positioned in the gripper such that when the boat is held by the gripper the conduit will be fluidly connected to the second vacuum inlet.

14. A component handling assembly according to a claim 10, wherein the assembly further comprises,
a platform having a plurality of temperature control station defined therein each of which can receive a boat; and
a heating and/or cooling means, which is arranged to be in thermal communication with the plurality of temperature control stations, for adjusting the temperature of boats which are located in a respective temperature control station.

15. A component handling assembly according to claim 14, wherein the assembly further comprises,
a third vacuum generating means which is fluidly connected to one or more temperature control stations such that it can apply a vacuum to boat(s) positioned in the temperature control station or each temperature control station, so as to reduce the air interface between the boat(s) and the temperature control station, thereby increasing thermal conduction between the boat and heating means and/or cooling means.

16. A boat according to claim 1 wherein said boat is configured to be modular, comprising a first modular piece which comprises the first vacuum inlet and second vacuum inlet, and a second modular piece which comprises the surface which has a plurality holes and said single vacuum chamber.

* * * * *